(12) United States Patent
Chen et al.

(10) Patent No.: US 12,378,994 B2
(45) Date of Patent: Aug. 5, 2025

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 105 days.

(21) Appl. No.: 18/409,821

(22) Filed: Jan. 11, 2024

(65) Prior Publication Data
US 2025/0043819 A1 Feb. 6, 2025

(30) Foreign Application Priority Data
Aug. 4, 2023 (TW) .................................. 112129647

(51) Int. Cl.
*A47B 88/443* (2017.01)
*A47B 88/477* (2017.01)
(Continued)

(52) U.S. Cl.
CPC ............ *F16C 29/02* (2013.01); *A47B 88/443* (2017.01); *A47B 88/477* (2017.01); *A47B 88/49* (2017.01); *F16C 29/10* (2013.01); *H05K 7/1489* (2013.01)

(58) Field of Classification Search
CPC ..... A47B 88/443; A47B 88/477; A47B 88/49; A47B 2210/007; A47B 2210/0081; F16C 29/02; F16C 29/10; H05K 7/1489
See application file for complete search history.

(56) References Cited

U.S. PATENT DOCUMENTS 10,041,535 B2   8/2018   Chen
10,477,965 B1 * 11/2019  Chen ...................... A47B 88/43
(Continued)

FOREIGN PATENT DOCUMENTS

CN   114847691 B  * 11/2023 ............. A47B 88/40
EP   4 018 883 A1    6/2022
(Continued)

*Primary Examiner* — Phillip A Johnson
(74) *Attorney, Agent, or Firm* — Winston Hsu

(57) ABSTRACT

A slide rail assembly includes a first rail, a second rail, an auxiliary member, a blocking member and an operating member. The auxiliary member is arranged on the second rail. The blocking member is pivotally connected to the second rail. When the second rail is located at an extended position relative to the first rail, a blocking feature on the first rail blocks the blocking member in a first state for preventing the second rail from displacing away from the extended position along a retracting direction. When the operating member moves from a first operating position to a second operating position to drive the blocking member to move to a second state, the blocking feature does not block the blocking member in the second state, and the operating member engages with a predetermined portion of the auxiliary member to retain the operating member at the second operating position.

20 Claims, 20 Drawing Sheets

(51) Int. Cl.
  *A47B 88/49* (2017.01)
  *F16C 29/02* (2006.01)
  *F16C 29/10* (2006.01)
  *H05K 7/14* (2006.01)

(56) References Cited

U.S. PATENT DOCUMENTS

| | | |
|---|---|---|
| 10,716,398 B1 | 7/2020 | Chen |
| 11,246,410 B2 | 2/2022 | Chen |
| 11,406,187 B2 | 8/2022 | Chen |
| 11,641,939 B2 | 5/2023 | Chen |
| 11,641,940 B2 | 5/2023 | Chen |
| 2016/0296017 A1* | 10/2016 | Chen .................. H05K 7/183 |
| 2020/0214444 A1* | 7/2020 | Chen .................. A47B 88/473 |

FOREIGN PATENT DOCUMENTS

| | | |
|---|---|---|
| EP | 4 035 568 A1 | 8/2022 |
| JP | 2020-182821 A | 11/2020 |
| JP | 2022-99225 A | 7/2022 |

* cited by examiner

SLIDE RAIL ASSEMBLY

BACKGROUND OF THE INVENTION

1. Field of the Invention

The present invention relates to a slide rail product, and more specifically, to a slide rail assembly which allows operation in a narrow space.

2. Description of the Prior Art

In U.S. Pat. No. 10,041,535 B2, it discloses a slide rail assembly including a first rail, a second rail, a third rail, a locking member and an operating member. The second rail is displaceable relative to the first rail from a first position to a second position. The third rail is displaceable relative to the second rail. The locking member is mounted on the second rail and configured to engage with an engaging portion of the first rail for preventing the second rail from displacing relative to the first rail from the second position to the first position when the second rail is located at the second position. The operating member is configured to be operated to move relative to the second rail from a first predetermined position to a second predetermined position for disengaging the locking member from the engaging portion of the first rail. However, an alternative solution is needed.

SUMMARY OF THE INVENTION

It is an objective of the present invention to provide a slide rail assembly which allows operation in a narrow space.

According to an aspect of the present invention, a slide rail assembly includes a first rail, a blocking feature, a second rail, an auxiliary member, a pivoting shaft, a blocking member and an operating member. The blocking feature is arranged on the first rail. The second rail is displaceable relative to the first rail. The auxiliary member is arranged on the second rail. The auxiliary member includes a resilient arm and a predetermined portion arranged on the resilient arm. The blocking member is pivotally connected to the second rail by the pivoting shaft. The blocking member is movably switchable between a first state and a second state relative to the second rail. The blocking member includes a blocking portion and an abutting portion. The pivoting shaft is located between the blocking portion and the abutting portion. The operating member is configured to operate the blocking member, and the operating member includes an engaging feature. When the second rail is located at a first extended position relative to the first rail, the blocking feature blocks the blocking portion of the blocking member in the first state for preventing the second rail from displacing away from the first extended position along a retracting direction. When the operating member moves from a first operating position to a second operating position, the abutting portion of the blocking member is driven by the operating member to switch the blocking member from the first state to the second state, such that the blocking feature does not block the blocking portion of the blocking member in the second state for allowing the second rail to displace relative to the first rail away from the first extended position along the retracting direction. When the operating member is located at the second operating position, the engaging feature engages with the predetermined portion of the auxiliary member to retain the operating member at the second operating position.

According to another aspect of the present invention, a slide rail assembly includes a first rail, a blocking feature, a positioning feature, a second rail, an auxiliary member, a third rail, a pivoting shaft, a blocking member, a positioning member and an operating member. The blocking feature is arranged on the first rail. The positioning feature is arranged on the first rail. The second rail is displaceable relative to the first rail. The auxiliary member is arranged on the second rail. The auxiliary member includes a resilient arm and a predetermined portion arranged on the resilient arm. The third rail is displaceable relative to the second rail. The blocking member and the positioning member are pivotally connected to the second rail by the pivoting shaft. The blocking member is movably switchable between a first state and a second state relative to the second rail. The positioning member is movably switchable between a first state and a second state relative to the second rail. The blocking member includes a blocking portion and an abutting portion. The pivoting shaft is located between the blocking portion and the abutting portion. The operating member is configured to operate the blocking member, and the operating member includes an engaging feature. When the second rail is located at a first extended position relative to the first rail, the blocking feature blocks the blocking portion of the blocking member in the first state for preventing the second rail from displacing relative to the first rail away from the first extended position along a retracting direction. When the operating member moves from a first operating position to a second operating position, the abutting portion of the blocking member is driven by the operating member to switch the blocking member from the first state to the second state, such that the blocking feature does not block the blocking portion of the blocking member in the second state for allowing the second rail to displace relative to the first rail away from the first extended position along the retracting direction. When the operating member is located at the second operating position, the engaging feature engages with the predetermined portion of the auxiliary member to retain the operating member at the second operating position. When the operating member is located at the second operating position, the operating member is configured to retain the blocking member in the second state. When the second rail is located at the first extended position relative to the first rail and the blocking member is in the second state, the blocking feature does not block the blocking member in the second state for allowing the second rail to displace relative to the first rail from the first extended position to a retracted position along the retracting direction.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
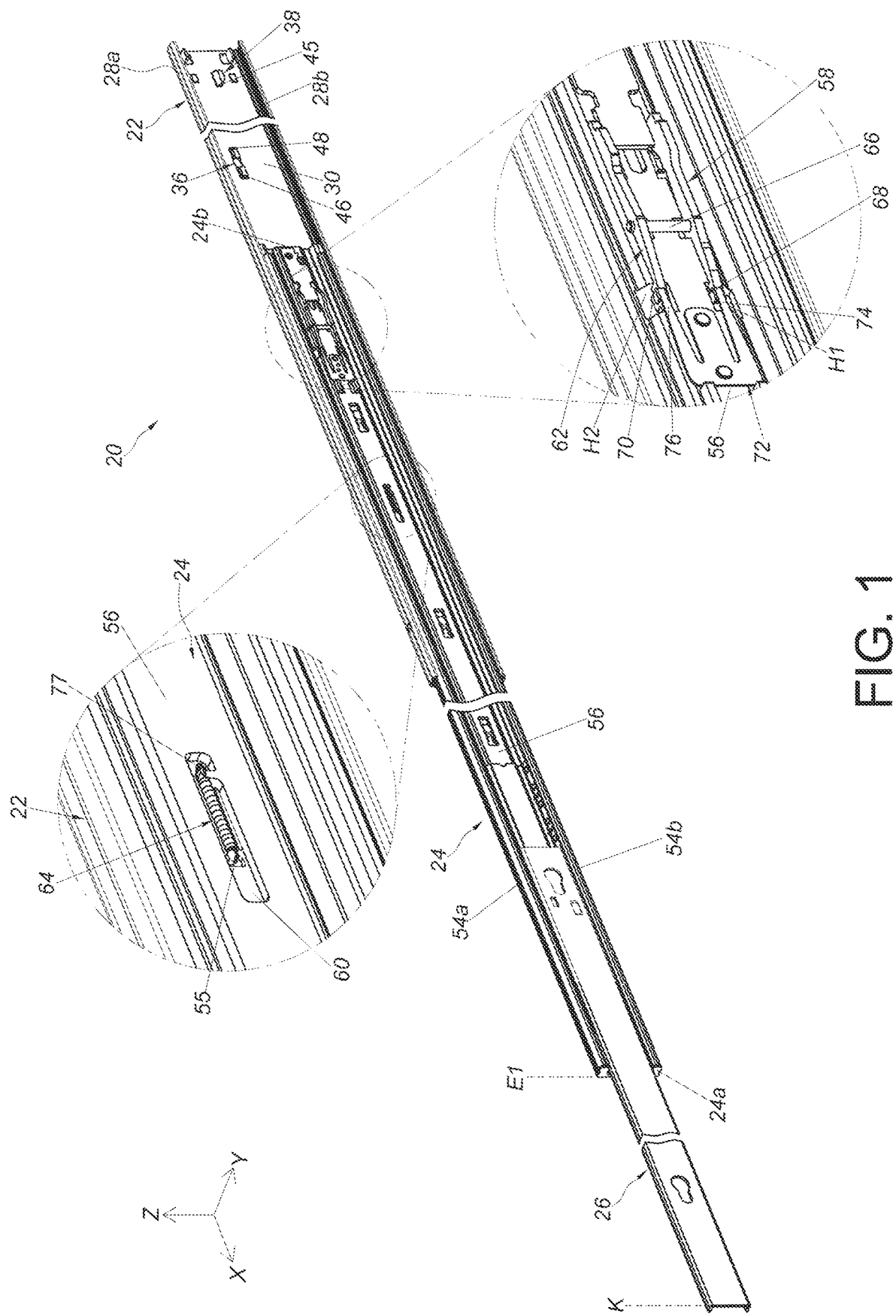
FIG. 1 is a schematic diagram of a slide rail assembly in an extended state according to an embodiment of the present invention.
Figure 2:
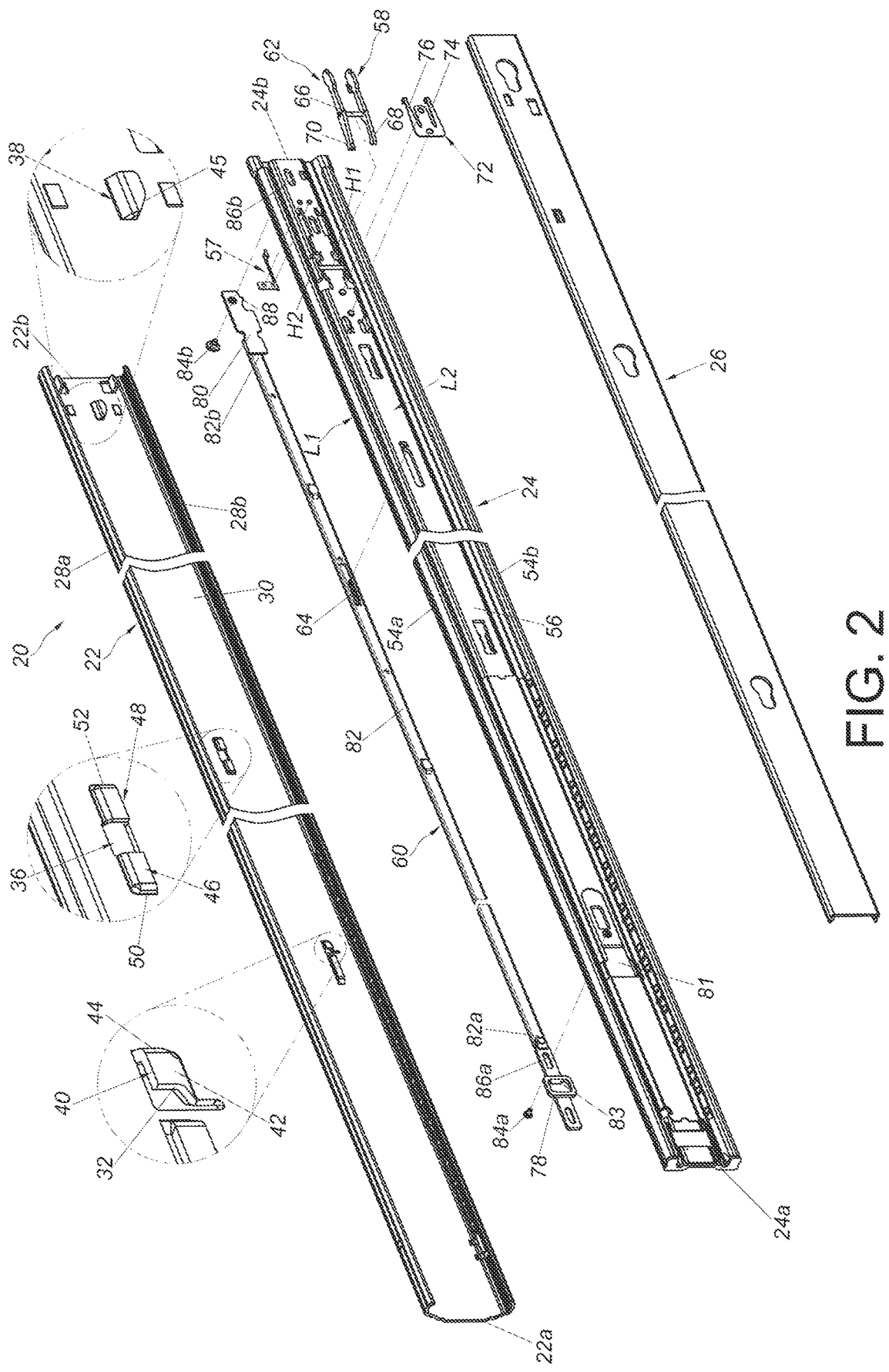
FIG. 2 is an exploded diagram of the slide rail assembly according to the embodiment of the present invention.

As shown in FIG. 1 and FIG. 2, a slide rail assembly 20 includes a first rail 22 and a second rail 24. Preferably, the slide rail assembly 20 further includes a third rail 26. The second rail 24 is movably mounted between the first rail 22 and the third rail 26. In this embodiment, by way of example, the first rail 22, the second rail 24 and the third rail 26 can be an outer rail, a middle rail and an inner rail, respectively, and the first rail 22, the second rail 24 and the third rail 26 can displace relative to one another along a longitudinal direction. As shown in FIG. 1, when the slide rail assembly 20 is in an extended state, e.g., a fully extended state, the second rail 24 is located at a first extended position E1 relative to the first rail 22, and the third rail 26 is located at an opened position K relative to the second rail 24.

In this embodiment, by way of example, the longitudinal direction can be defined by a length direction or a displacing direction of the first rail 22, the second rail 24 or the third rail 26, and parallel to an X axis. A transverse direction can be defined by a lateral direction or a width direction of the first rail 22, the second rail 24 or the third rail 26, and parallel to a Y axis. A vertical direction can be defined by a height direction of the first rail 22, the second rail 24 or the third rail 26, and parallel to a Z axis.

The first rail 22 includes a first wall 28a, a second wall 28b and a longitudinal wall 30 connected between the first wall 28a and the second wall 28b of the first rail 22. The first wall 28a, the second wall 28b and the longitudinal wall 30 of the first rail 22 cooperatively define a first channel of the first rail 22 configured to at least partially accommodate the second rail 24. As shown in FIG. 2, a blocking feature 32 is arranged on the first rail 22. Preferably, a positioning feature 36 and a releasing feature 38 are further arranged on the first rail 22. The blocking feature 32, the positioning feature 36 and the releasing feature 38 are sequentially arranged on the longitudinal wall 30 of the first rail 22 along the longitudinal direction from front to back.

Preferably, the first rail 22 includes a front end portion 22a and a rear end portion 22b. The releasing feature 38 is more adjacent to the rear end portion 22b of the first rail 22 than the blocking feature 32 and the positioning feature 36. The blocking feature 32 is more adjacent to the front end portion 22a of the first rail 22 than the positioning feature 36 and the releasing feature 38.

Preferably, the slide rail assembly 20 further includes a predetermined structure 40 arranged on the longitudinal wall 30 of the first rail 22. The predetermined structure 40 includes the blocking feature 32, a longitudinal portion 42 and a guiding portion 44. The longitudinal portion 42 is located between the blocking feature 32 and the guiding portion 44. In this embodiment, by way of example, the blocking feature 32 can be a blocking wall or an erecting wall, and the guiding portion 44 can be an inclined surface or an arc surface. However, the present invention is not limited to this embodiment.

Preferably, in this embodiment, by way of example, the releasing feature 38 can be a protrusion protruding from the longitudinal wall 30 of the first rail 22 along the transverse direction or the lateral direction of the first rail 22 and includes a guiding section 45, and the guiding section 45 can be an inclined surface or an arc surface. However, the present invention is not limited to this embodiment.

Preferably, the first rail 22 further includes a first auxiliary portion 46 and a second auxiliary portion 48. The positioning feature 36 is defined between the first auxiliary portion 46 and the second auxiliary portion 48. The first auxiliary portion 46 and the second auxiliary portion 48 are spaced apart from each other. In this embodiment, by way of example, the first auxiliary portion 46 can be a protrusion protruding from the longitudinal wall 30 of the first rail 22 along the transverse direction or the lateral direction of the first rail 22, and the first auxiliary portion 46 and the second auxiliary portion 48 can be substantially symmetrical structures.

Preferably, the first auxiliary portion 46 and the second auxiliary portion 48 include a first guiding structure 50 and a second guiding structure 52, respectively. The first guiding structure 50 is configured to guide the positioning member 62 to pass over the first auxiliary portion 46. The second guiding structure 52 is configured to guide the positioning member 62 to pass over the second auxiliary portion 48. In this embodiment, by way of example, the first guiding structure 50 and the second guiding structure 52 can be inclined surfaces or arc surfaces. However, the present invention is not limited to this embodiment.

The second rail 24 includes a first wall 54a, a second wall 54b and a longitudinal wall 56 connected between the first wall 54a and the second wall 54b of the second rail 24. The first wall 54a, the second wall 54b and the longitudinal wall 56 of the second rail 24 cooperatively define a second channel of the second rail 24 configured to at least partially accommodate the third rail 26. The longitudinal wall 56 of the second rail 24 includes a first side L1 and a second side L2 opposite to the first side L1. The first side L1 and the second side 12 of the longitudinal wall 56 of the second rail 24 are adjacent to the first rail 22 and the third rail 26, respectively.

The slide rail assembly 20 further includes an auxiliary member 57, a blocking member 58 and an operating member 60. Preferably, the slide rail assembly 20 further includes a positioning member 62 and a recovering resilient member 64. The blocking member 58 and the positioning member 62 are movably mounted on the second rail 24. In this embodiment, the blocking member 58 and the positioning member 62 can be pivotally connected to the second side L2 of the longitudinal wall 56 of the second rail 24 by a pivoting shaft 66, and an extending direction of the pivoting shaft 66 is parallel to the height direction or the vertical direction of the second rail 24, i.e., the blocking member 58 and the positioning member 62 are configured to pivot relative to the longitudinal wall 56 of the second rail 24 laterally or transversely.

Preferably, the second rail 24 includes at least one hole communicated between the first side L1 of the longitudinal wall 56 of the second rail 24 and the second side L2 of the longitudinal wall 56 of the second rail 24. In this embodiment, by way of example, the second rail 24 includes a first hole H1 and a second hole H2. Furthermore, the auxiliary member 57 is arranged on the second rail 24 and configured to cooperate with the operating member 60. The blocking member 58 includes a blocking portion 68 extending through the first hole H1 toward the longitudinal wall 30 of the first rail 22, and the blocking portion 68 of the blocking member 58 is configured to cooperate with the blocking feature 32 on the first rail 22. In addition, the positioning member 62 includes a positioning portion 70 extending through the second hole H2 toward the longitudinal wall 30 of the first rail 22, and the positioning portion 70 of the positioning member 62 is configured to cooperate with the positioning feature 36 on the first rail 22.

Preferably, the slide rail assembly 20 further includes a predetermined object 72 connected to the longitudinal wall 56 of the second rail 24. The predetermined object 72 includes a first resilient feature 74 and a second resilient feature 76 configured to provide a first resilient force and a second resilient force to the blocking member 58 and the positioning member 62, respectively. In this embodiment, by way of example, the predetermined object 72 can be a resilient clip or any other resilient member, and the first resilient feature 74 and the second resilient feature 76 can be two arm portions of the predetermined object 72. However, the present invention is not limited to this embodiment.

The operating member 60 is movably mounted on the second rail 24 and configured to operate one of the blocking member 58 and the positioning member 62.

Preferably, the operating member 60 is arranged on the longitudinal wall 56 of the second rail 24, and the operating member 60 includes an operating portion 78, a driving portion 80 and an extending portion 82 connected between the operating portion 78 and the driving portion 80. The second rail 24 includes a front end portion 24a and a rear end portion 24b. The operating portion 78 is located adjacent to the front end portion 24a of the second rail 24.

Preferably, the operating portion 78 and the driving portion 80 are located adjacent to a front end 82a and a rear end 82b of the extending portion 82, respectively.

Preferably, the second rail 24 includes a through hole 81 communicated between the first side L1 of the longitudinal wall 56 of the second rail 24 and the second side L2 of the longitudinal wall 56 of the second rail 24. The operating portion 78 includes a corresponding space 83 located at a position corresponding to the through hole 81. A size of the through hole 81 is greater than a size of the corresponding space 83. In this embodiment, by way of example, the corresponding space 83 can be a recessed structure or a hollow structure configured to allow an insertion of a user's finger therein for easy operation of the operating member 60. However, the present invention is not limited to this embodiment.

Preferably, the driving portion 80 is located adjacent to the blocking member 58 and the positioning member 62.

Preferably, the slide rail assembly 20 further includes at least one mounting feature and at least one connecting feature configured to cooperate with the at least one mounting feature for allowing the operating member 60 to move relative to the second rail 24 within a limited range along the longitudinal direction. In this embodiment, by way of example, a first connecting feature 86*a* and a second connecting feature 86*b* can be two longitudinal holes arranged on the operating member 60 and the second rail 24, respectively, and a first mounting feature 84*a* and a second mounting feature 84*b* can be two protruding pins arranged on the second rail 24 and the operating member 60, respectively, and passing through the first connecting feature 86*a* and the second connecting feature 86*b*, respectively. However, the present invention is not limited to this embodiment.

The recovering resilient member 64 is configured to provide a recovering resilient force F' to the operating member 60. As shown in FIG. 1, in this embodiment, by way of example, two ends of the recovering resilient member 64 are connected to a first predetermined section 55 of the operating member 60 and a second predetermined section 77 of the second rail 24, respectively. However, the present invention is not limited to this embodiment.

Figure 4:
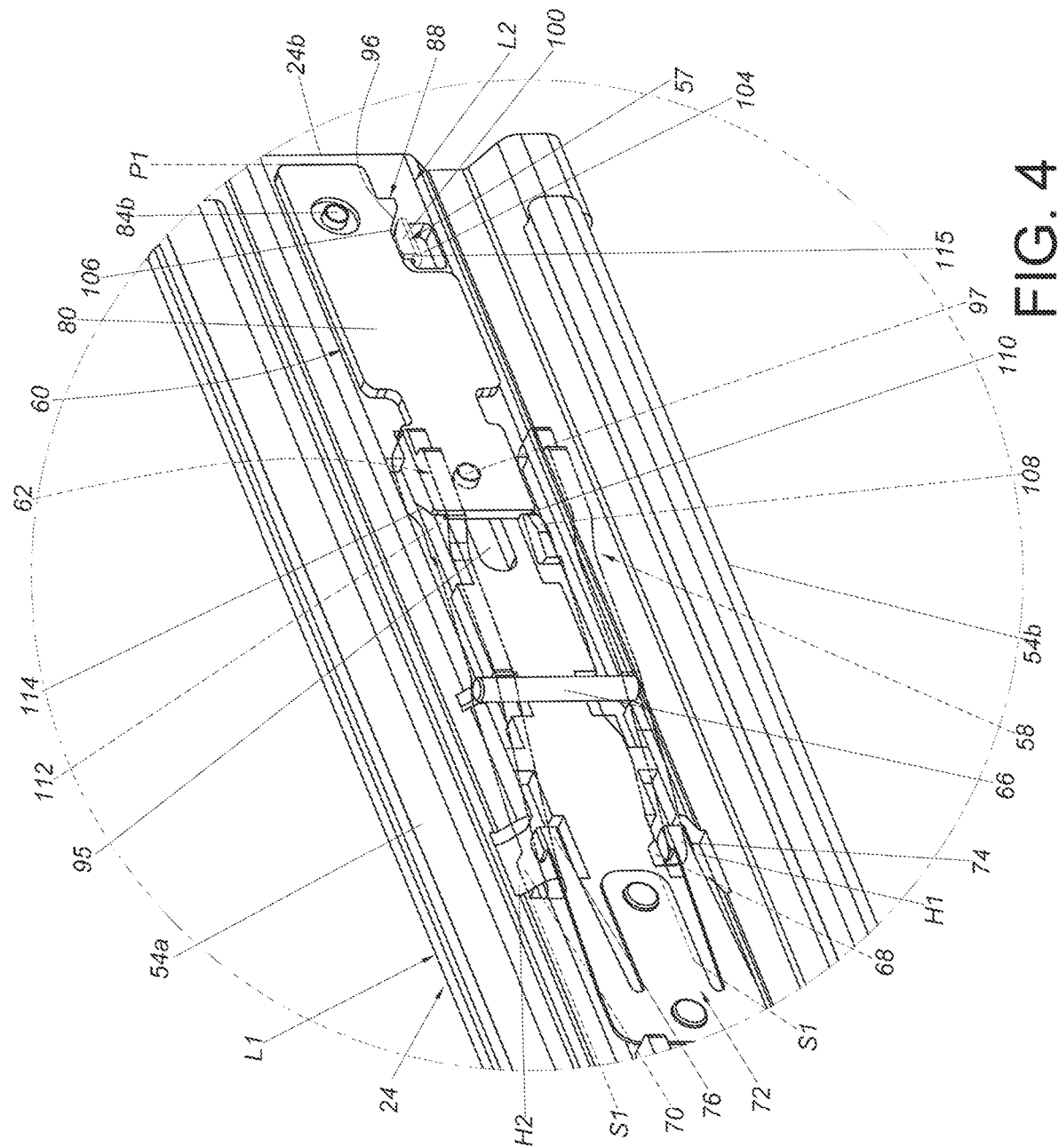
FIG. 4 is an enlarged diagram of an A portion of the slide rail assembly as shown in FIG. 3 according to the embodiment of the present invention.

Preferably, as shown in FIG. 4, the operating member 60 includes an engaging feature 88. In this embodiment, by way of example, the engaging feature 88 is arranged on the driving portion 80. However, the present invention is not limited to this embodiment.

Preferably, as shown in FIG. 4, in this embodiment, by way of example, the engaging feature 88 can be a hook portion and include a first guiding surface 96, e.g., an inclined surface or an arc surface.

Figure 3:
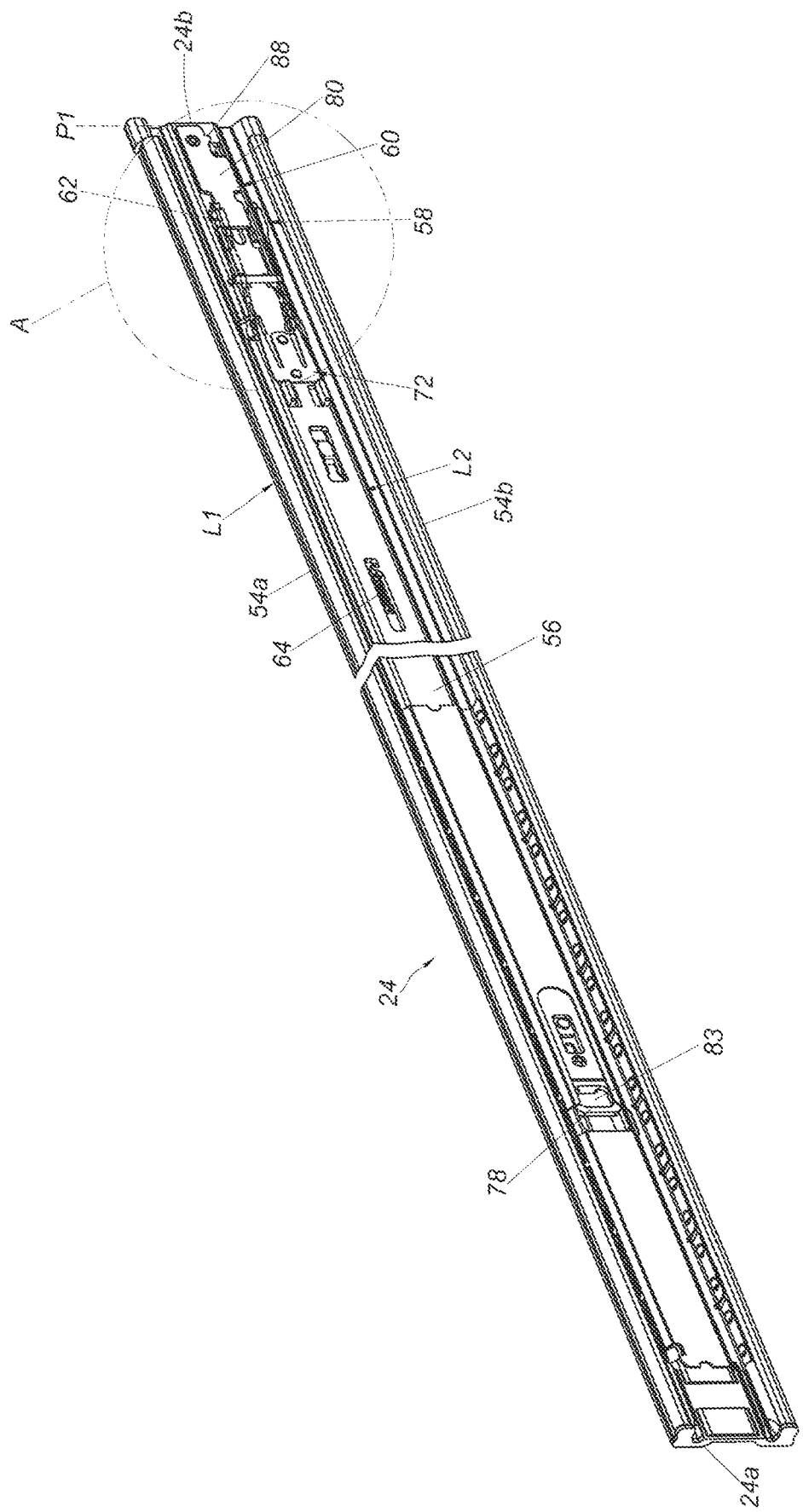
FIG. 3 is a partial diagram of the slide rail assembly as an operating member is located at a first operating position according to the embodiment of the present invention.
Figure 5:
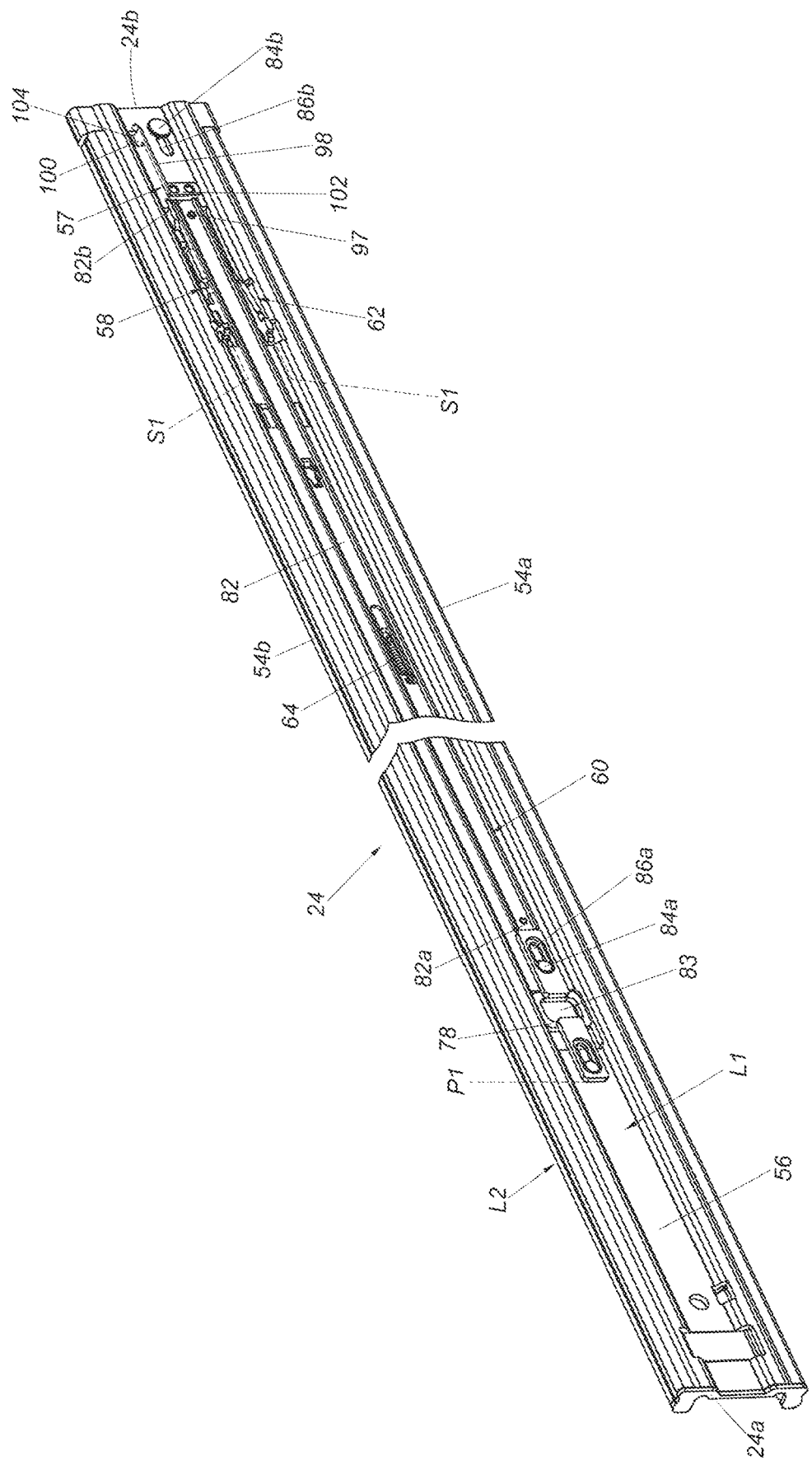
FIG. 5 is another partial diagram of the slide rail assembly as the operating member is located at the first operating position according to the embodiment of the present invention.

As shown in FIG. 3 to FIG. 5, the blocking member 58 and the positioning member 62 are located adjacent to the rear end portion 24*b* of the second rail 24. The driving portion 80 and the extending portion 82 of the operating member 60 are located adjacent to the second side L2 and the first side L1 of the longitudinal wall 56 of the second rail 24, respectively. As shown in FIG. 3 to FIG. 5, in this embodiment, by way of example, the driving portion 80 of the operating member 60 can be an independent member located adjacent to the second side L2 of the longitudinal wall 56 of the second rail 24 and fixedly connected to the rear end 82*b* of the extending portion 82 of the operating member 60 located adjacent to the first side L1 of the longitudinal wall 56 of the second rail 24, by a fixing member 97 extending from the second side L2 of the longitudinal wall 56 of the second rail 24 to the first side L1 of the longitudinal wall 56 of the second rail 24 through a restraining hole 95. However, the present invention is not limited to this embodiment. Besides, as shown in FIG. 4, the blocking member 58 and the positioning member 62 are both configured to be in a first state S1 relative to the second rail 24, and the operating member 60 is configured to be located at a first operating position P1 relative to the second rail 24.

Specifically, as shown in FIG. 4 and FIG. 5, the auxiliary member 57 includes a resilient arm 98 and a predetermined portion 100 arranged on the resilient arm 98. Preferably, as shown in FIG. 4 and FIG. 5, the auxiliary member 57 further includes a mounting portion 102 connected to the first side L1 of the longitudinal wall 56 of the second rail 24. The resilient arm 98 extends from the mounting portion 102. The predetermined portion 100 extends from the first side L1 of the longitudinal wall 56 of the second rail 24 to the second side L2 of the longitudinal wall 56 of the second rail 24 through a predetermined hole 104 of the second rail 24. The predetermined portion 100 is configured to cooperate with the engaging feature 88 of the operating member 60.

Preferably, the predetermined portion 100 includes a second guiding surface 106, e.g., an inclined surface or an arc surface, located at a position corresponding to the first guiding surface 96 of the engaging feature 88.

Preferably, the blocking member 58 further includes an abutting portion 108, and the pivoting shaft 66 is located between the blocking portion 68 and the abutting portion 108 of the blocking member 58. As shown in FIG. 4, the abutting portion 108 is located at a position corresponding to a first driving section 110 of the driving portion 80 of the operating member 60 and for abutting against the first driving section 110 of the driving portion 80 of the operating member 60. As shown in FIG. 4, the first resilient feature 74 is configured to provide the first resilient force to the blocking member 58, e.g., the blocking portion 68 of the blocking member 58, for retaining the blocking member 58 in the first state S1, i.e., biasing the blocking portion 68 of the blocking member 58 to move toward the longitudinal wall 30 of the first rail 22.

Preferably, the positioning member 62 further includes an abutting section 112, and the pivoting shaft 66 is located between the positioning portion 70 and the abutting section 112 of the positioning member 62. As shown in FIG. 4, the abutting section 112 is located at a position corresponding to a second driving section 114 of the driving portion 80 of the operating member 60 and for abutting against the second driving section 114 of the driving portion 80 of the operating member 60. The second driving section 114 and the first driving section 110 are located at positions corresponding to each other and have substantially identical structures. As shown in FIG. 4, the second resilient feature 76 is configured to provide the second resilient force to the positioning member 62, e.g., the positioning portion 70 of the positioning member 62, for retaining the positioning member 62 in the first state S1, i.e., biasing the positioning portion 70 of the positioning member 62 to move toward the longitudinal wall 30 of the first rail 22.

Preferably, one of the abutting portion 108 of the blocking member 58 and the first driving section 110 of the operating member 60 includes a guiding feature, e.g., an inclined surface or an arc surface, for facilitating the operating member 60 to drive the blocking member 58 by a cooperation of the first driving section 110 and the abutting portion 108. Similarly, one of the abutting section 112 of the positioning member 62 and the second driving section 114 of the operating member 60 includes another guiding feature, e.g., an inclined surface or an arc surface, for facilitating the operating member 60 to drive the positioning member 62 by a cooperation of the second driving section 114 and the abutting section 112.

Figure 6:
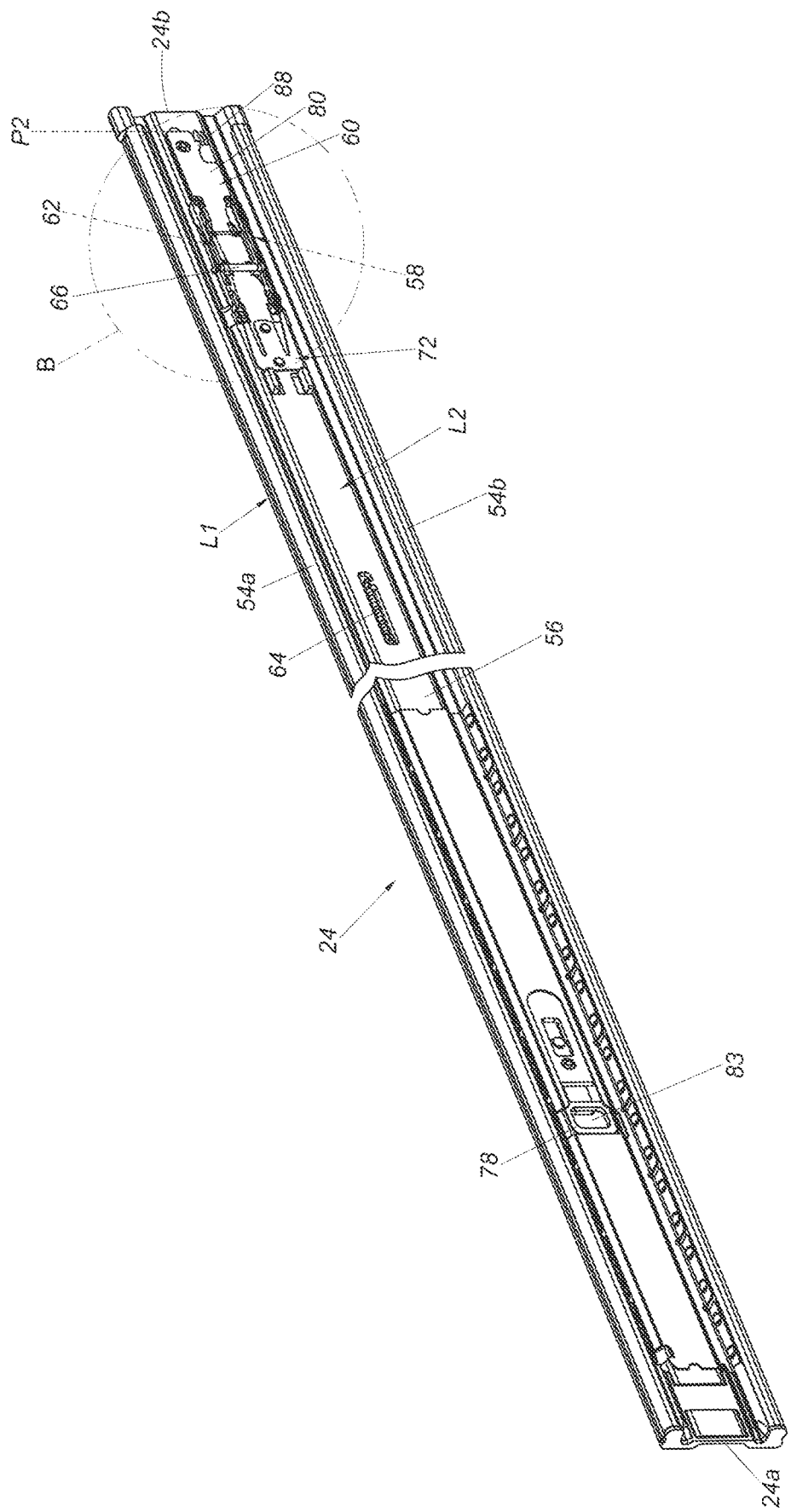
FIG. 6 is a partial diagram of the slide rail assembly as the operating member is located at a second operating position according to the embodiment of the present invention.
Figure 7:
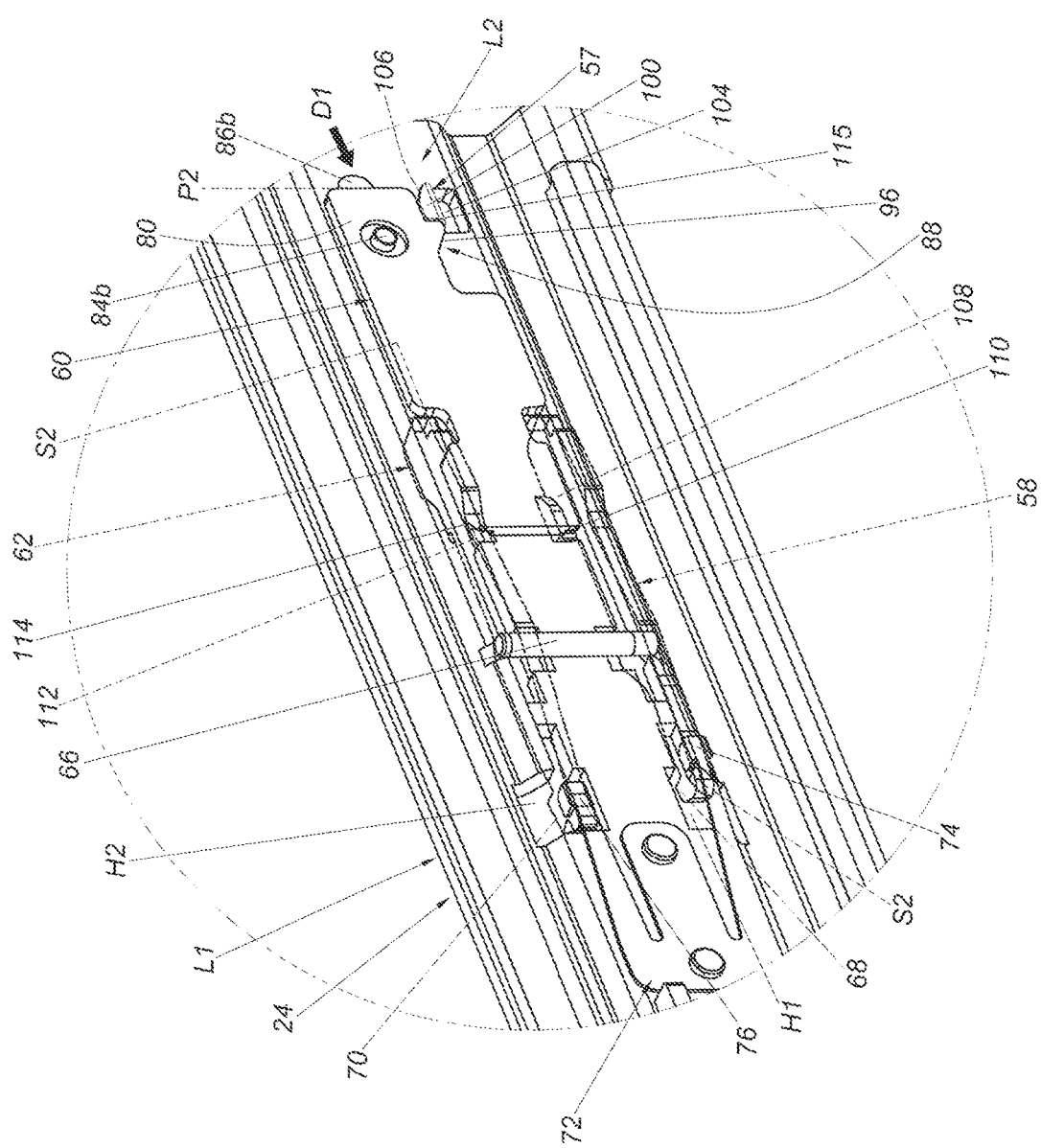
FIG. 7 is an enlarged diagram of a B portion of the slide rail assembly as shown in FIG. 6 according to the embodiment of the present invention.
Figure 8:
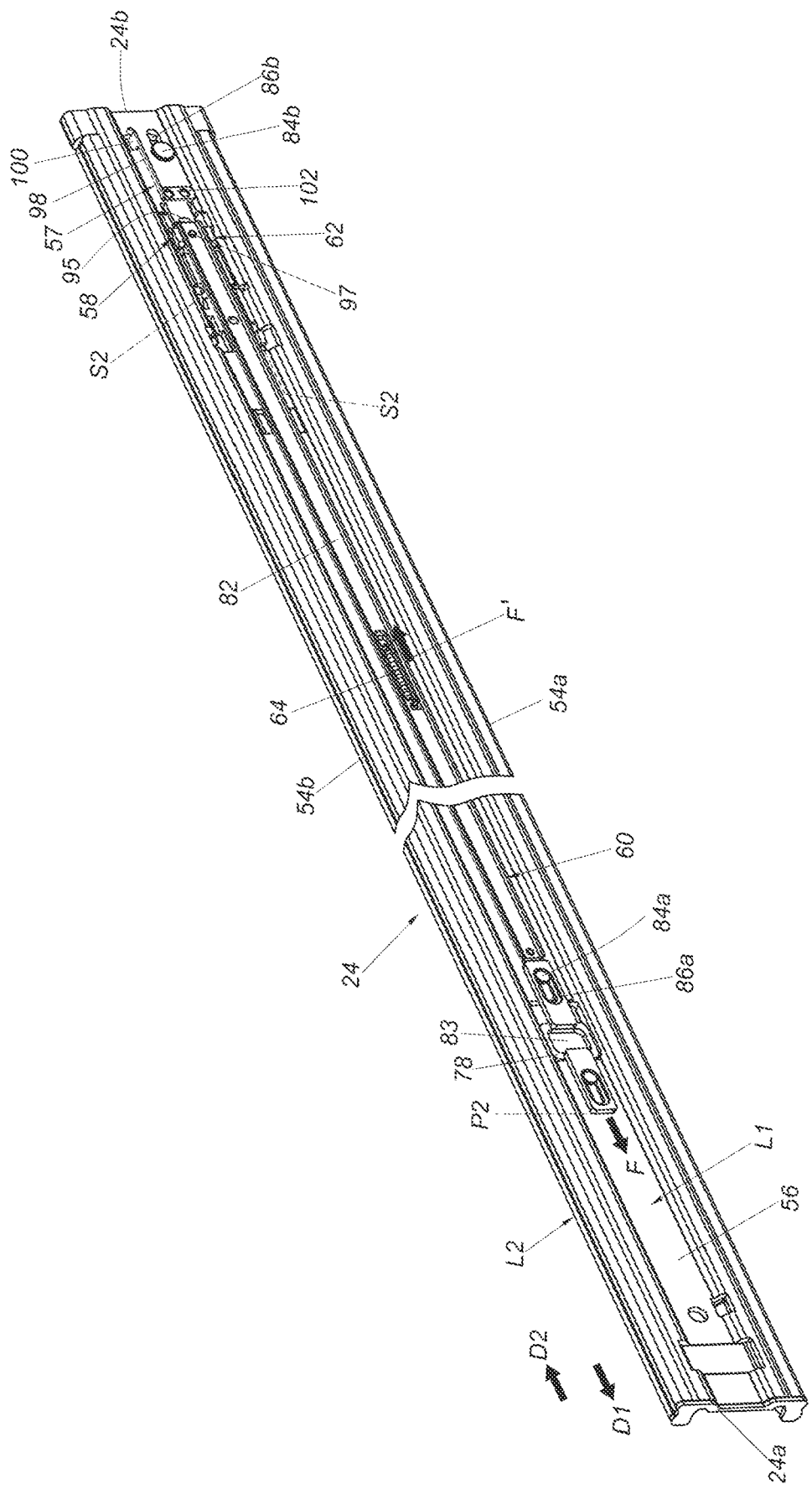
FIG. 8 is another partial diagram of the slide rail assembly as the operating member is located at the second operating position according to the embodiment of the present invention.

As shown in FIG. 6 to FIG. 8, when the operating member 60, e.g., the operating portion 78 of the operating member 60, is operated by an external force F along an opening direction D1 to move relative to the second rail 24 along the opening direction D1 from the first operating position P1 to a second operating position P2, the operating member 60 drives the blocking member 58 and the positioning member 62 to move, e.g., pivot laterally or transversely, from the first state S1 to the second state S2 by the first driving section 110 and the second driving section 114 of the driving portion 80, respectively, so as to move the blocking portion 68 of the blocking member 58 and the positioning portion 70 of the positioning member 62 away from the first rail 22, e.g., the longitudinal wall 30 of the first rail 22, by overcoming the first resilient force provided by the first resilient feature 74 and the second resilient force provided by the second resilient feature 76, respectively.

As shown in FIG. 7 and FIG. 8, when the operating member 60 is located at the second operating position P2, the recovering resilient member 64 is resiliently deformed to generate the recovering resilient force F', and the engaging feature 88 of the operating member 60 engages with the predetermined portion 100 of the auxiliary member 57 for retaining the operating member 60 at the second operating position P2.

Preferably, when the operating member 60 moves from the first operating position P1 as shown in FIG. 4 to the second operating position P2 as shown in FIG. 7, the first guiding surface 96 of the engaging feature 88 abuts against the second guiding surface 106 of the predetermined portion 100 for guiding the engaging feature 88 to engage with a blocking section 115 of the predetermined portion 100.

Preferably, as shown in FIG. 7, when the operating member 60 is located at the second operating position P2, the first driving section 110 and the second driving section 114 of the operating member 60 keep pressing the abutting portion 108 of the blocking member 58 and the abutting section 112 of the positioning member 62, respectively, so as to retain the blocking member 58 and the positioning member 62 at the second state S2.

Figure 9:
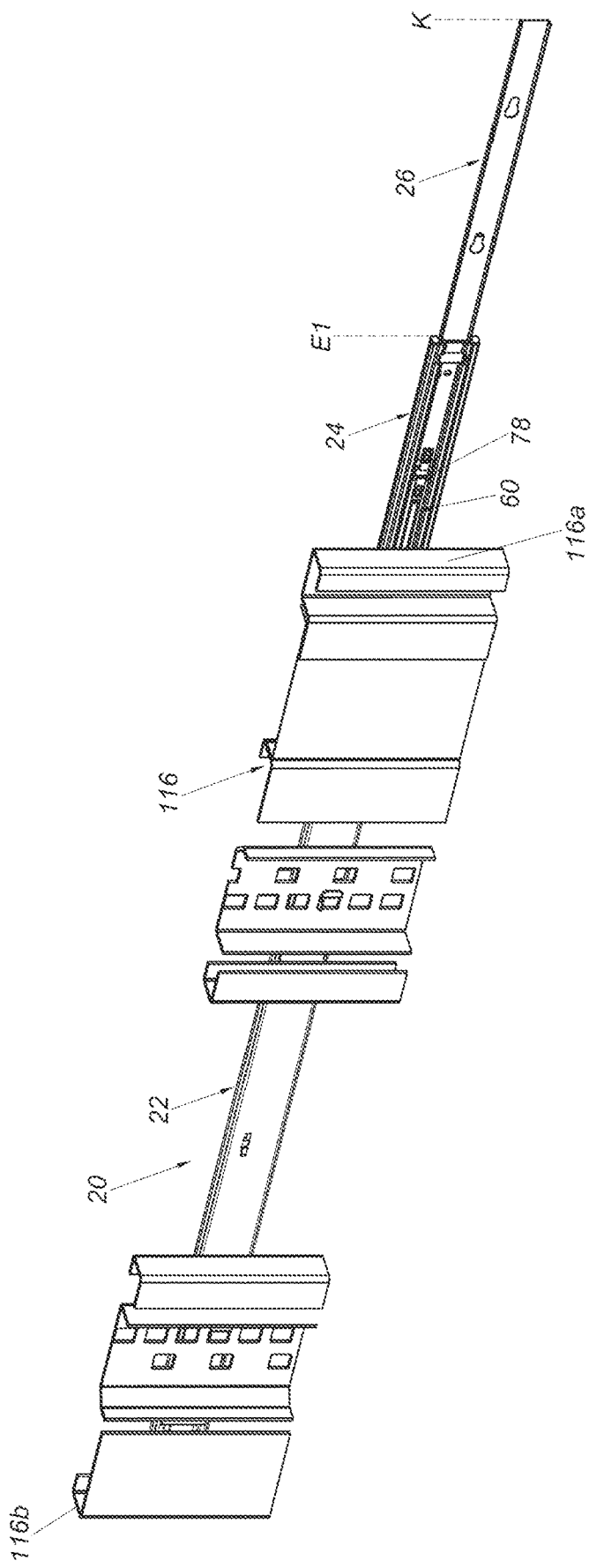
FIG. 9 is a diagram of the slide rail assembly adapted for a rack according to the embodiment of the present invention.

As shown in FIG. 9, the slide rail assembly 20 is mounted on a rack 116 and in the fully extended state. The first rail 22 is configured to be mounted, e.g., fixed, to the rack 116. The third rail 26 is configured to support a carried object, which is not shown in the figure. In such a way, the carried object can move into or out of the rack 116 by the slide rail assembly 20. The rack 116 includes a front end 116a and a rear end 116b. The operating portion 78 protrudes forwardly beyond the front end 116a of the rack 116 for easy operation.

Figure 10:
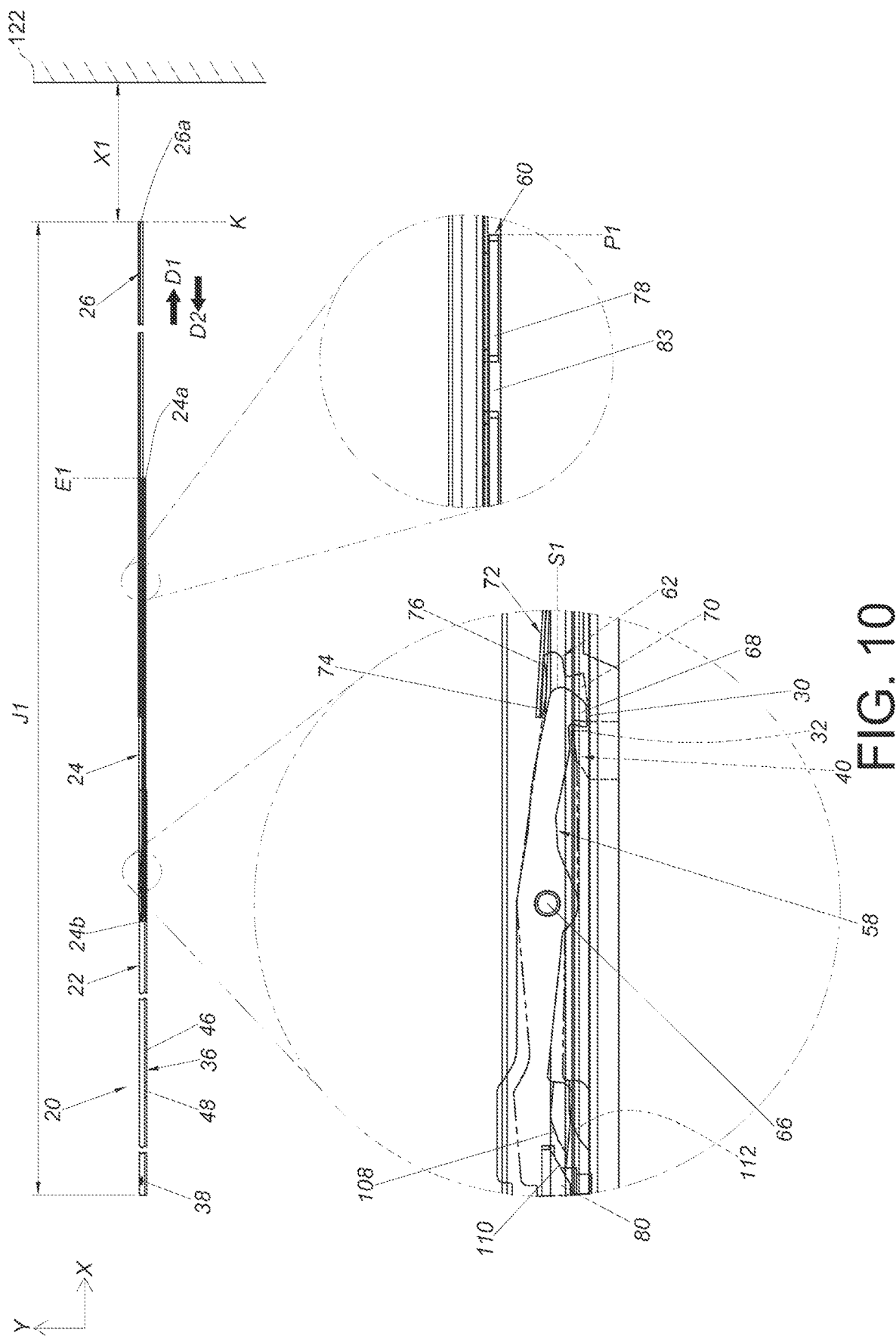
FIG. 10 is a diagram of the slide rail assembly as the second rail and the operating member are respectively located at a first extended position and the first operating position according to the embodiment of the present invention.

As shown in FIG. 10, the slide rail assembly 20 is in the fully extended state. The second rail 24 is located at the first extended position E1 relative to the first rail 22, and the third rail 26 is located at the opening position K relative to the second rail 24. It should be noticed that, when the second rail 24 and the third rail 26 are located at the first extended position E1 relative to the first rail 22 and at the opening position K relative to the second rail 24, respectively, the slide rail assembly 20 has a first length J1, and a first distance X1 is formed between a front end portion 26a of the third rail 26 and an object 122. However, the first distance X1 is too narrow or short to detach the third rail 26 from the second rail 24 along the opening direction D1. Besides, as shown in FIG. 10, when the second rail 24 is located at the first extended position E1 relative to the first rail 22, the blocking feature 32 blocks the blocking portion 68 of the blocking member 58 in the first state S1 for preventing the second rail 24 from displacing relative to the first rail 22 away from the first extended position E1 along a retracting direction D2, and the positioning portion 70 of the positioning member 62 in the first state S1 abuts against the longitudinal wall 30 of the first rail 22. Furthermore, at this moment, the operating member 60 is located at the first operating position P1. Therefore, the recovering resilient member 64 and the engaging feature 88 of the operating member 60 are in states as shown in FIG. 3 to FIG. 5, i.e., the recovering resilient member 64 is not resiliently deformed, and the engaging feature 88 of the operating member 60 does not engage with the predetermined portion 100 of the auxiliary member 57.

Figure 11:
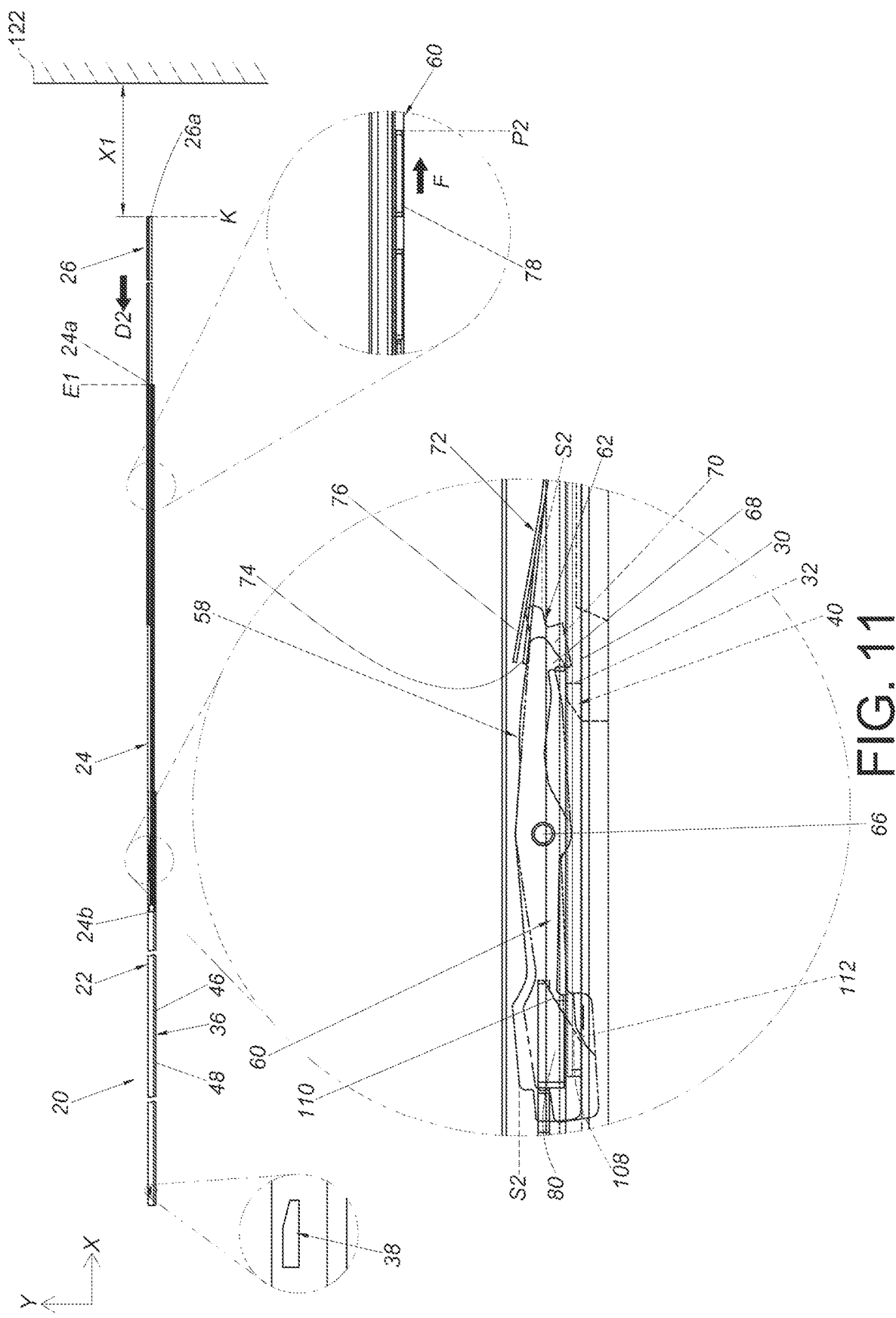
FIG. 11 is a diagram of the slide rail assembly as the second rail and the operating member are respectively located at the first extended position and the second operating position according to the embodiment of the present invention.

As shown in FIG. 10 and FIG. 11, when the operating portion 78 of the operating member 60 is operated by the external force F along the opening direction D1 to move relative to the second rail 24 along the opening direction D1 from the first operating position P1 to the second operating position P2, the operating member 60 drives the blocking member 58 and the positioning member 62 to move from the first state S1 to the second state S2 by the first driving section 110 and the second driving section 114 of the driving portion 80, respectively. When the blocking member 58 is in the second state S2, the blocking portion 68 of the blocking member 58 is moved away from the longitudinal wall 30 of the first rail 22 laterally or transversely. Therefore, the first resilient feature 74 is resiliently deformed by the blocking member 58 in the second state S2, and the blocking feature 32 does not block the blocking portion 68 of the blocking member 58 in the second state S2 for allowing the second rail 24 to displace relative to the first rail 22 away from the first extended position E1 along the retracting direction D2. When the positioning member 62 is in the second state S2, the positioning portion 70 of the positioning member 62 is moved away from the longitudinal wall 30 of the first rail 22 laterally or transversely. Therefore, the second resilient feature 76 is resiliently deformed by the positioning member 62 in the second state S2, and the positioning portion 70 of the positioning member 62 is misaligned with the positioning feature 36 along the longitudinal direction.

Figure 12:
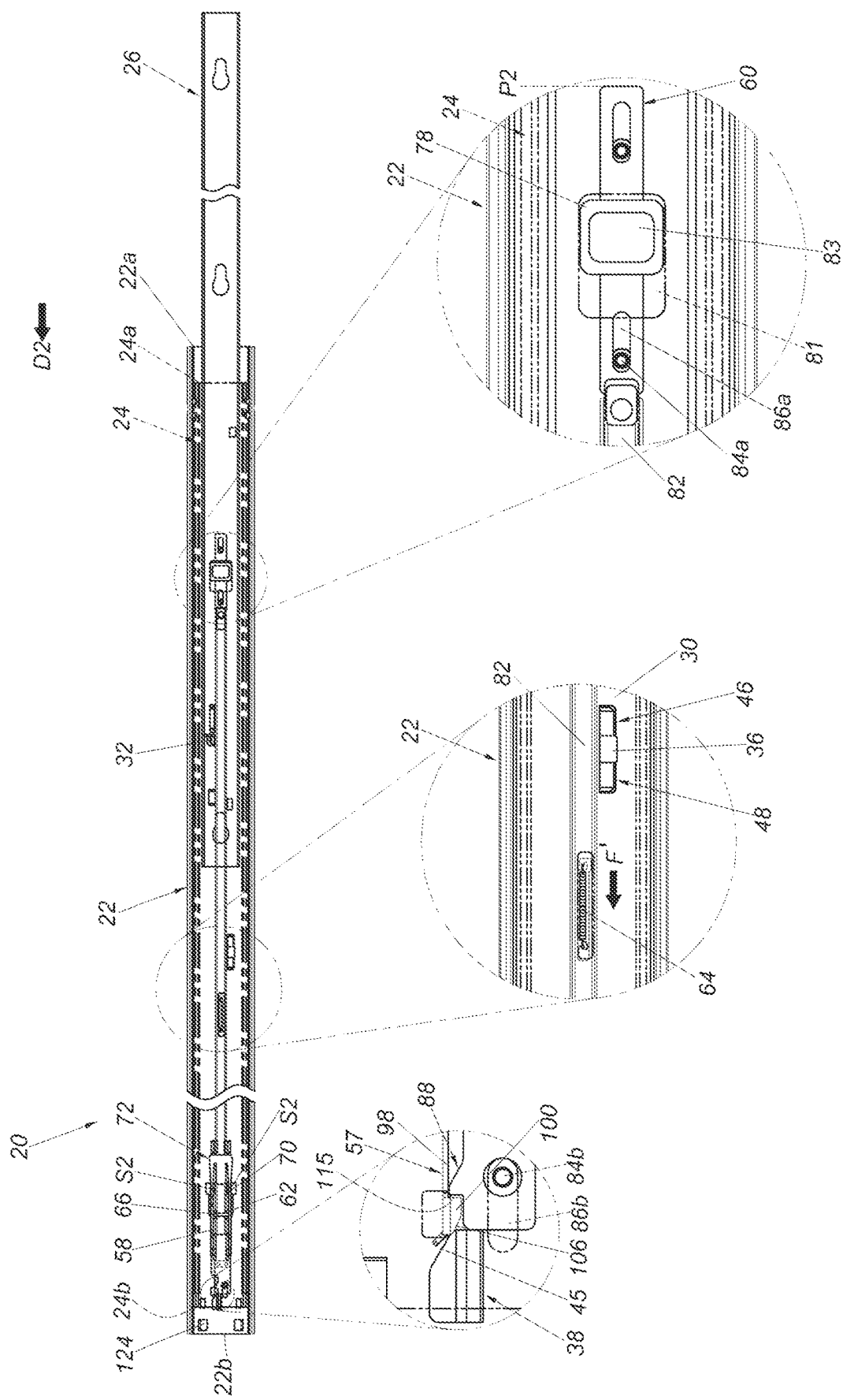
FIG. 12 is a diagram of the slide rail assembly as the second rail displaces relative to the first rail away from the first extended position toward a retracted position along a retracting direction according to the embodiment of the present invention.

When the operating member 60 is located at the second operating position P2 as shown in FIG. 12, the recovering resilient member 64 and the engaging feature 88 of the operating member 60 are in states as shown in FIG. 7 and FIG. 8, i.e., the recovering resilient member 64 is resiliently deformed for generating the recovering resilient force F' along the retracting direction D2, and the engaging feature 88 of the operating member 60 engages with the blocking section 115 of the predetermined portion 100 of the auxiliary member 57 for retaining the operating member 60 at the second operating position P2.

Figure 13:
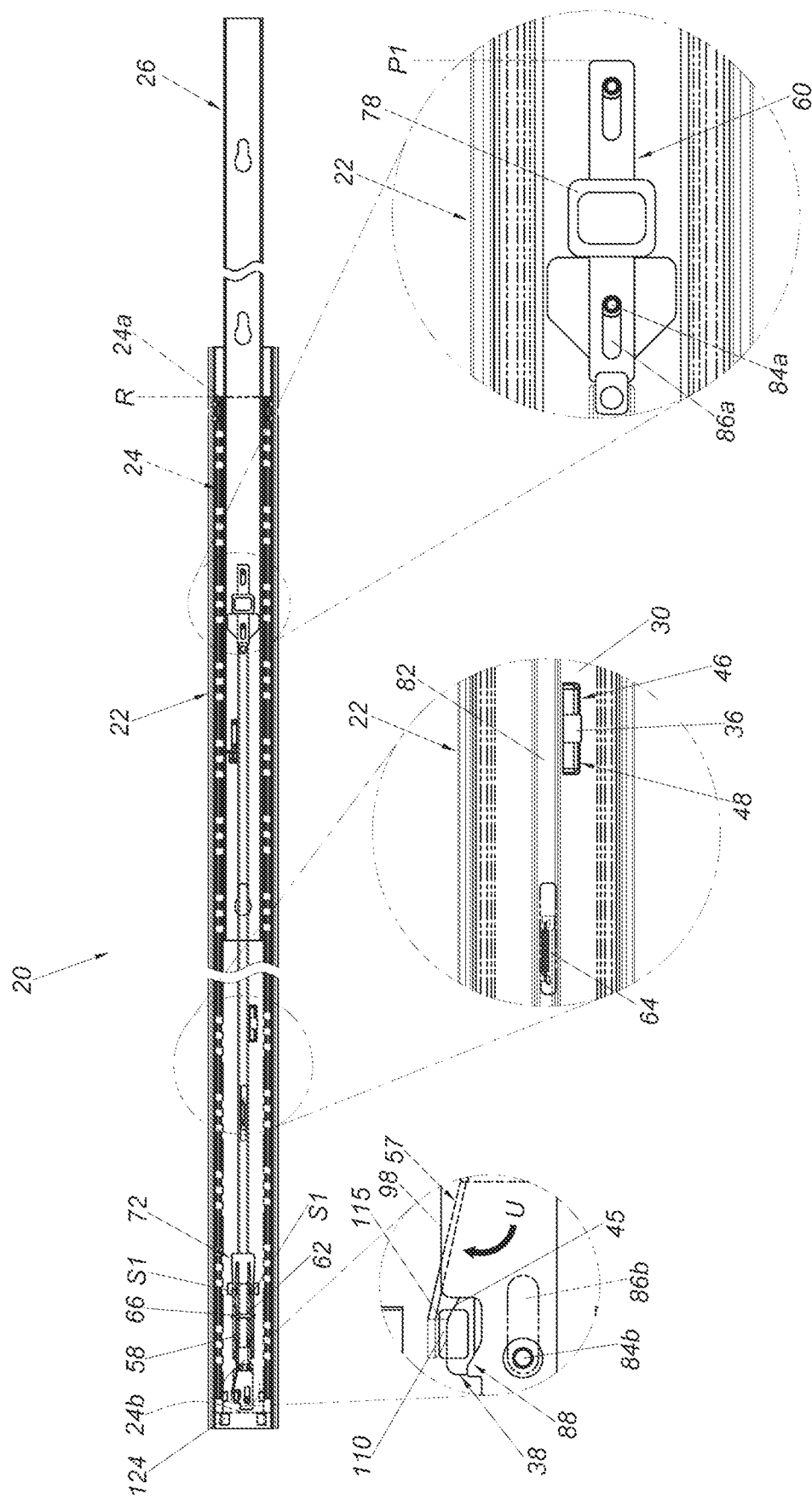
FIG. 13 is a diagram of the slide rail assembly as the second rail is located at the retracted position according to the embodiment of the present invention.

As shown in FIG. 12 and FIG. 13, when the engaging feature 88 of the operating member 60 disengages from the predetermined portion 100 of the auxiliary member 57, the operating member 60 moves from the second operating position P2 to the first operating position P1 in response to the recovering resilient force F' provided by the recovering resilient member 64. Furthermore, as shown in FIG. 12, when the second rail 24 displaces relative to the first rail 22 along the retracting direction D2 from the first extended position E1 to a retracted position R, the positioning portion 70 of the positioning member 62 in the second state S2 is misaligned with the positioning feature 36 along the longitudinal direction, such that the positioning member 62 can pass over the positioning feature 36 along the retracting direction D2 without any obstruction, i.e., the positioning portion 70 of the positioning member 62 is prevented from being engaged with the positioning feature 36. Besides, when the second rail 24 displaces along the retracting direction D2 from a position as shown in FIG. 12 to a position as shown in FIG. 13, the second guiding surface 106 of the predetermined portion 100 of the auxiliary member 57 abuts against the guiding section 45 of the releasing feature 38 on the first rail 22, such that the resilient arm 98 of the auxiliary member 57 moves along a predetermined direction U for disengaging the engaging feature 88 of the operating member 60 from the blocking section 115 of the predetermined portion 100 of the auxiliary member 57, so as to allow the operating member 60 to move from the second operating position P2 as shown in FIG. 12 to the first operating position P1 as shown in FIG. 13 along the retracting direction D2 in response to the recovering resilient force F' provided by the recovering resilient member 64. Besides, when the operating member 60 is located at the first operating position P1 as shown in FIG. 13, the blocking member 58 and the positioning member 62 are in states as shown in FIG. 4, i.e., the blocking member 58 and the positioning member 62 move from the second state S2 to the first state S1 in response to the first resilient force provided by the first resilient feature 74 and the second resilient force provided by the second resilient feature 76, respectively.

Preferably, the first rail 22 further includes at least one blocking structure 124. In this embodiment, by way of example, the blocking structure 124 can be a protrusion. However, the present invention is not limited to this embodiment. As shown in FIG. 13, when the second rail 24 is located at the retracted position R relative to the first rail 22, the blocking structure 124 is configured to block the rear end portion 24b of the second rail 24 for preventing the second rail 24 from displacing away from the retracted position R along the retracting direction D2. In other words, the retracted position R can be a fully retracted position.

Figure 14:
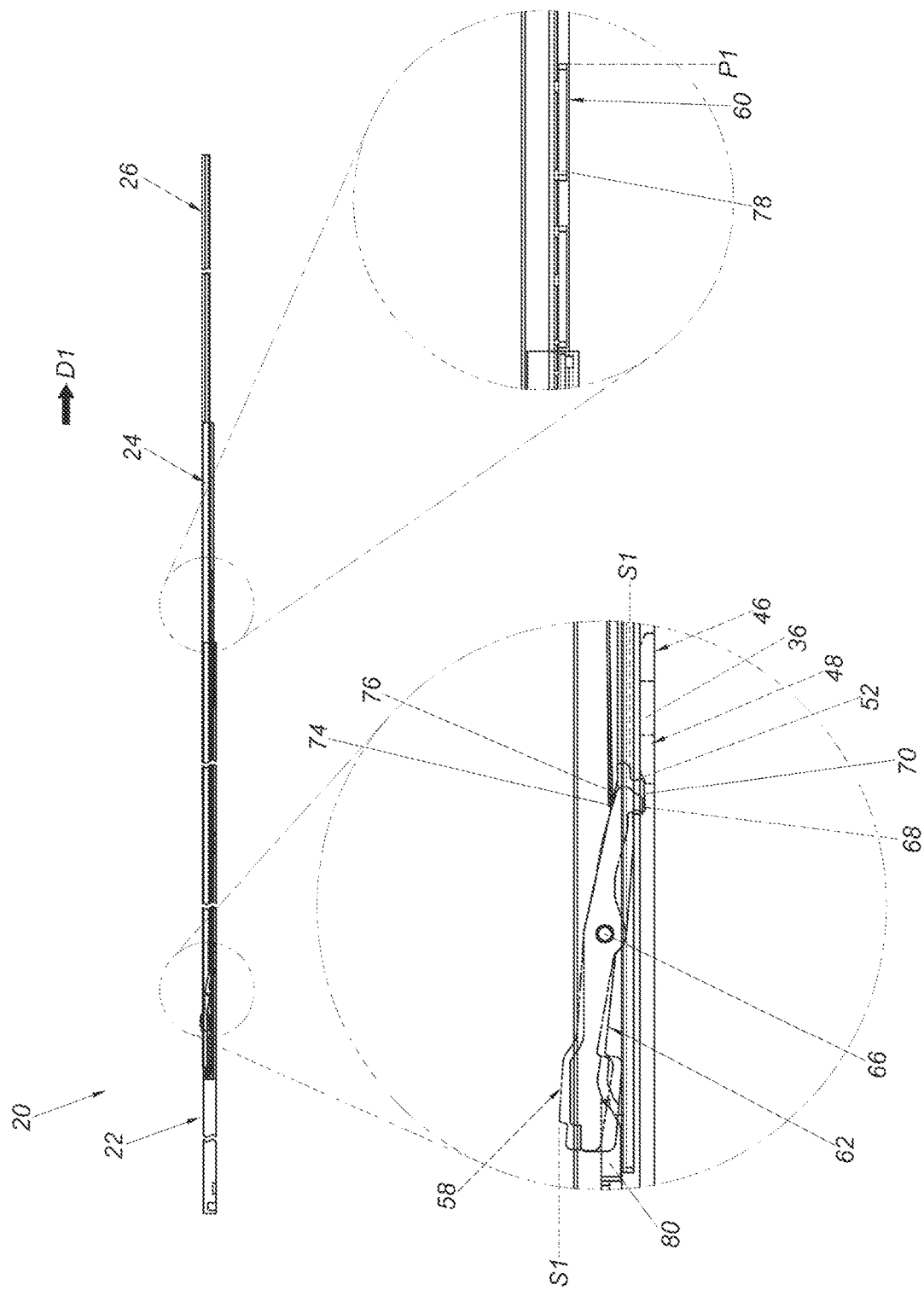
FIG. 14 is a diagram of the slide rail assembly as the second rail displaces relative to the first rail away from the retracted position along an opening direction according to the embodiment of the present invention.
Figure 15:
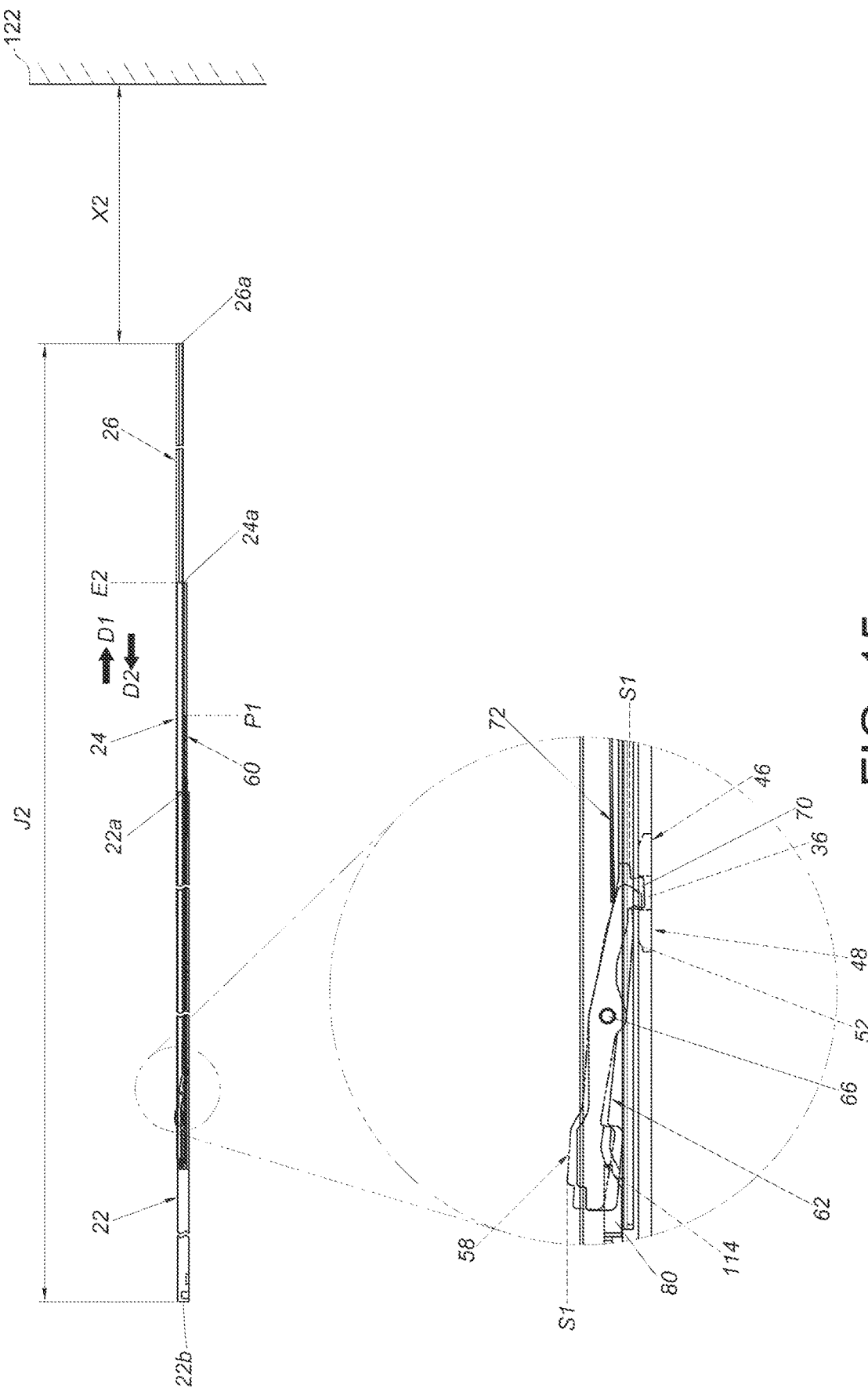
FIG. 15 is a diagram of the slide rail assembly as the second rail and the operating member are respectively located at a second extended position and the first operating position according to the embodiment of the present invention.

As shown in FIG. 14 and FIG. 15, when the second rail 24 displaces relative to the first rail 22 from the retracted position R to a second extended position E2 along the opening direction D1, the positioning feature 36 is configured to engage with the positioning member 62 in the first state S1 for preventing the second rail 24 from displacing relative to the first rail 22 away from the second extended position E2 along the retracting direction D2 or the opening direction D1.

Furthermore, when the second rail 24 displaces relative to the first rail 22 from the retracted position R to the second extended position E2 along the opening direction D1, the positioning portion 70 of the positioning member 62 abuts against the second guiding structure 52 of the second auxiliary portion 48 to guide the positioning member 62 to move away from the first state to pass over the second auxiliary portion 48, and then the positioning member 62 moves back to the first state to engage the positioning portion 70 of the positioning member 62 with the positioning feature 36 in response to the second resilient force provided by the second resilient feature 76. When the positioning portion 70 of the positioning member 62 in the first state S1 engages with the positioning feature 36, the positioning portion 70 of the positioning member 62 is blocked between the first auxiliary portion 46 and the second auxiliary portion 48 for preventing the second rail 24 from displacing relative to the first rail 22 away from the second extended position E2 along the retracting direction D2 or the opening direction D1.

Figure 16:
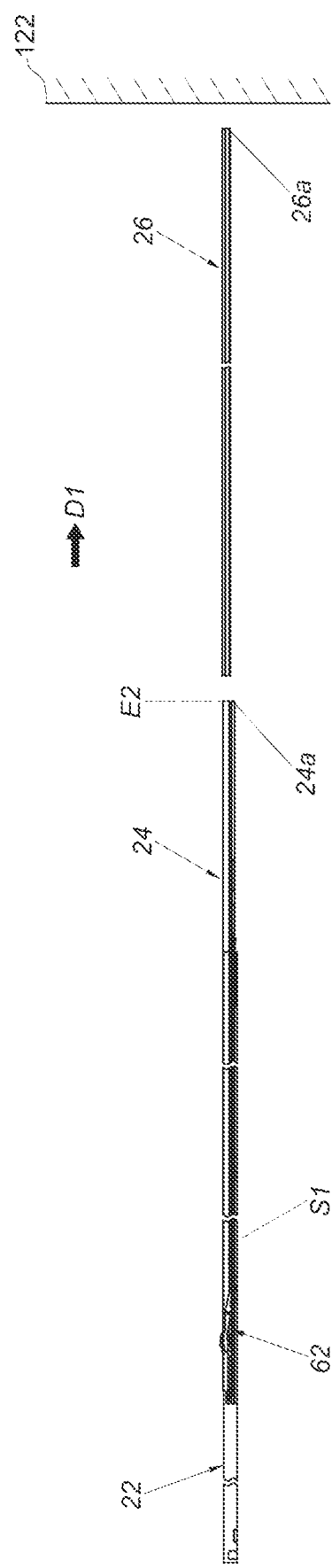
FIG. 16 is a diagram of the slide rail assembly as a third rail is detached from the second rail located at the second extended position according to the embodiment of the present invention.

As shown in FIG. 15 and FIG. 16, when the second rail 24 is located at the second extended position E2 relative to the first rail 22, the slide rail assembly 20 has a second length J2 less than the first length J1, and a second distance X2 is formed between the front end portion 26a of the third rail 26 and the object 122 and greater than the first distance X1, which facilitates the third rail 26 to be detached from the second rail 24 along the opening direction D1.

Figure 17:
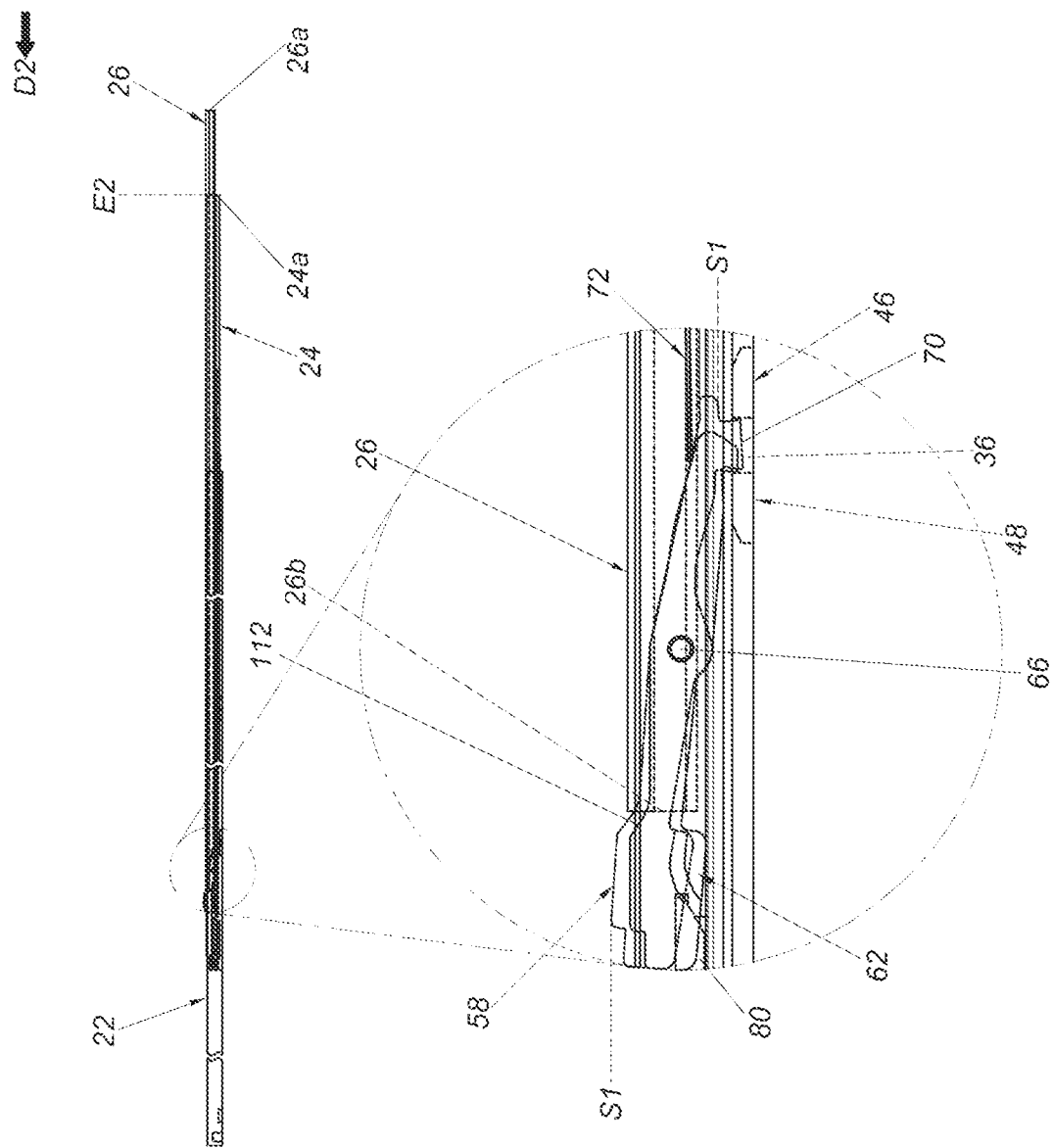
FIG. 17 is a diagram of the slide rail assembly as the blocking member and the positioning member have not been driven to move away from the first state by the third rail displacing relative to the second rail along the retracting direction according to the embodiment of the present invention.
Figure 18:
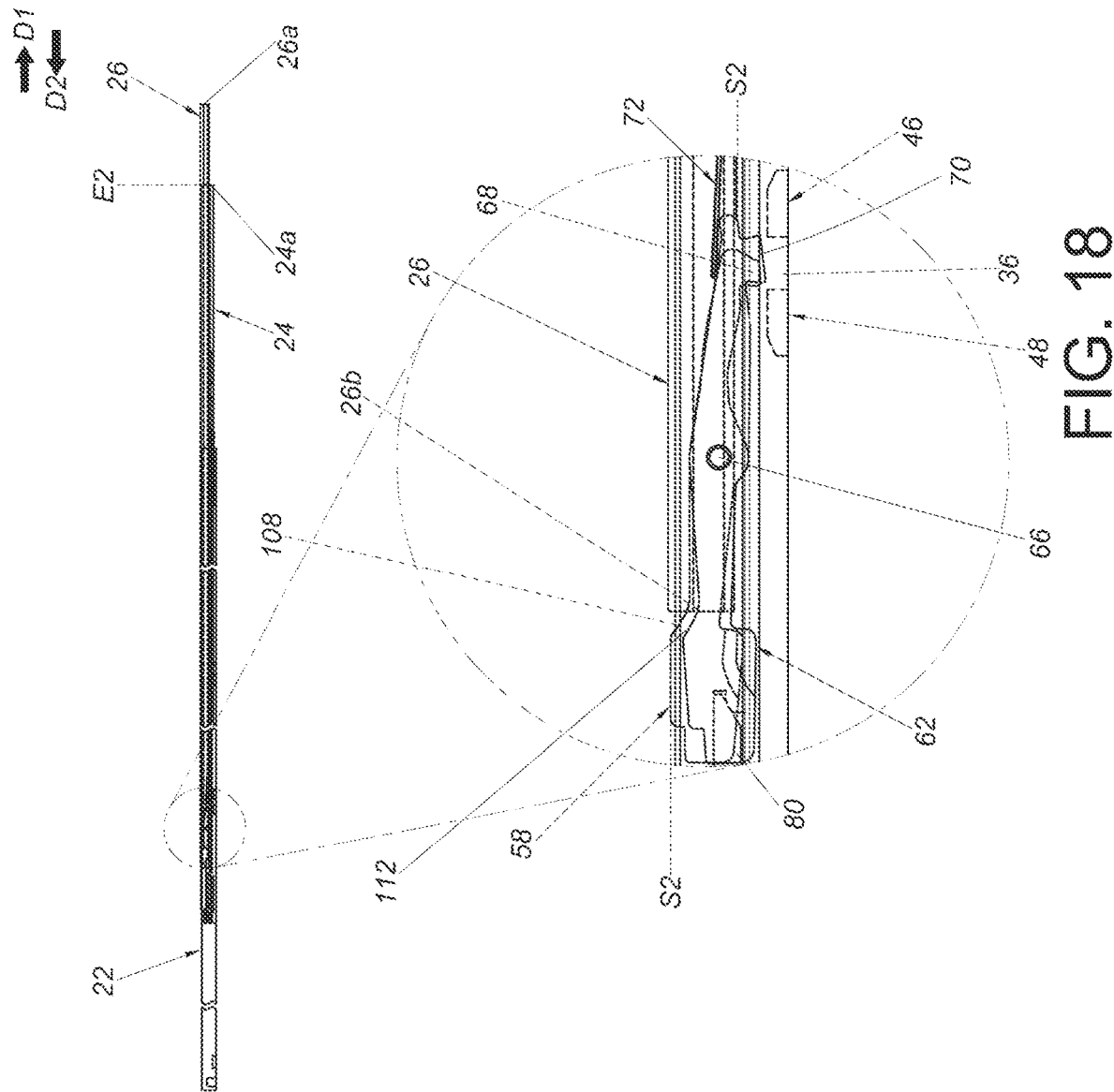
FIG. 18 is a diagram of the slide rail assembly as the blocking member and the positioning member are driven to move from the first state to the second state by the third rail displacing relative to the second rail along the retracting direction according to the embodiment of the present invention.

As shown in FIG. 17 and FIG. 18, when it is desired to displace the second rail 24 relative to the first rail 22 from the second extended position E2 to the retracted position R along the retracting direction D2 or to the first extended position E1 along the opening direction D1, the third rail 26 can be operated to displace, e.g., away from the opening position K, along the retracting direction D2 to abut against the abutting section 112 of the positioning member 62, e.g., by a rear end portion 26b of the third rail 26, to move the positioning member 62 away from the first state S1 for disengaging the positioning portion 70 of the positioning member 62 from the positioning feature 36, so as to allow the second rail 24 to displace relative to the first rail 22 from the second extended position E2 to the retracted position R along the retracting direction D2 or to the first extended position E1 along the opening direction D1.

Preferably, during the aforementioned displacement of the third rail 26 along the retracting direction D2, the third rail 26 or a predetermined feature, e.g., a protrusion, on the third rail 26 abuts against the abutting portion 108 of the blocking member 58 to move the blocking member 58 away from the first state S1.

Figure 19:
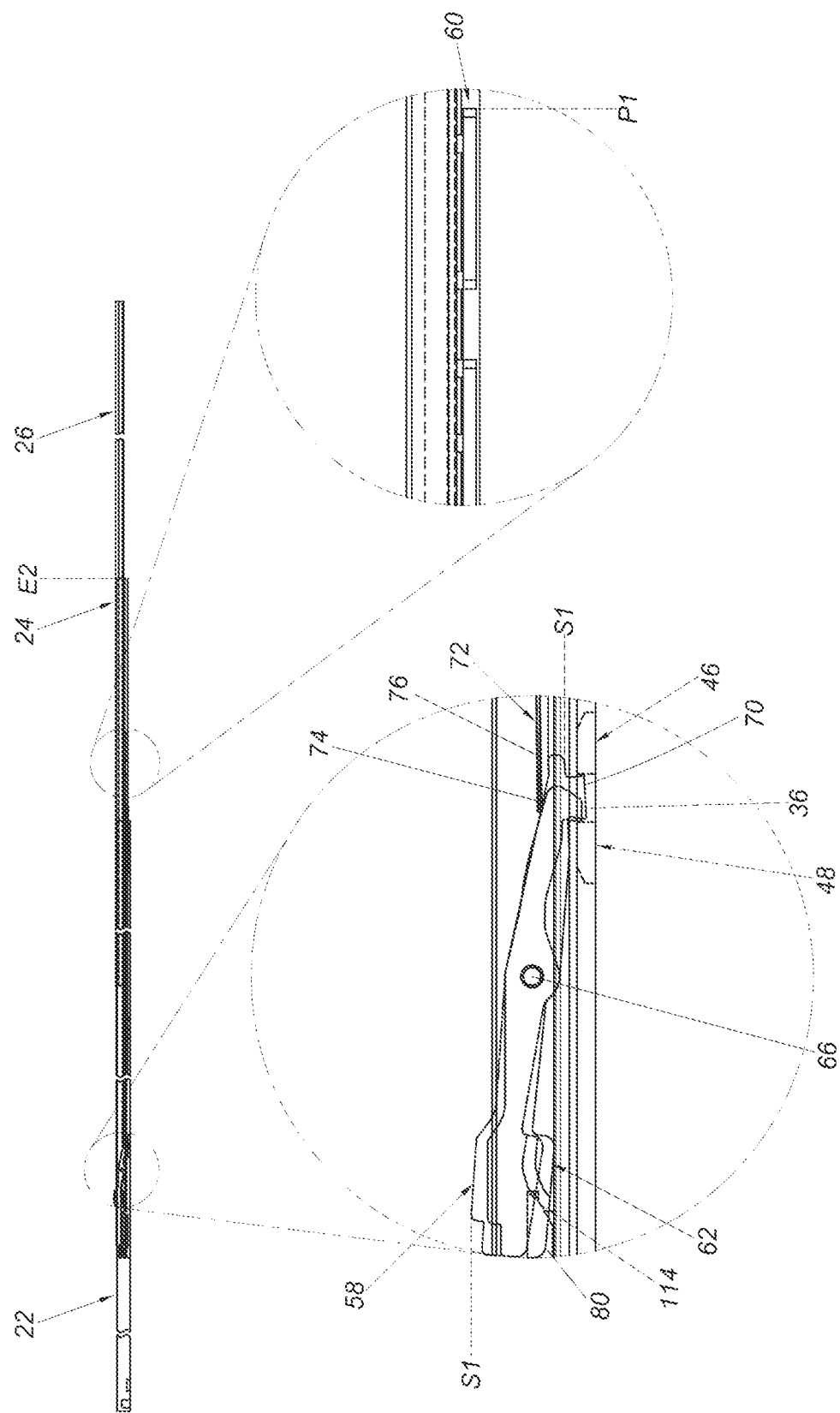
FIG. 19 is another diagram of the slide rail assembly as the second rail and the operating member are respectively located at the second extended position and the first operating position according to the embodiment of the present invention.
Figure 20:
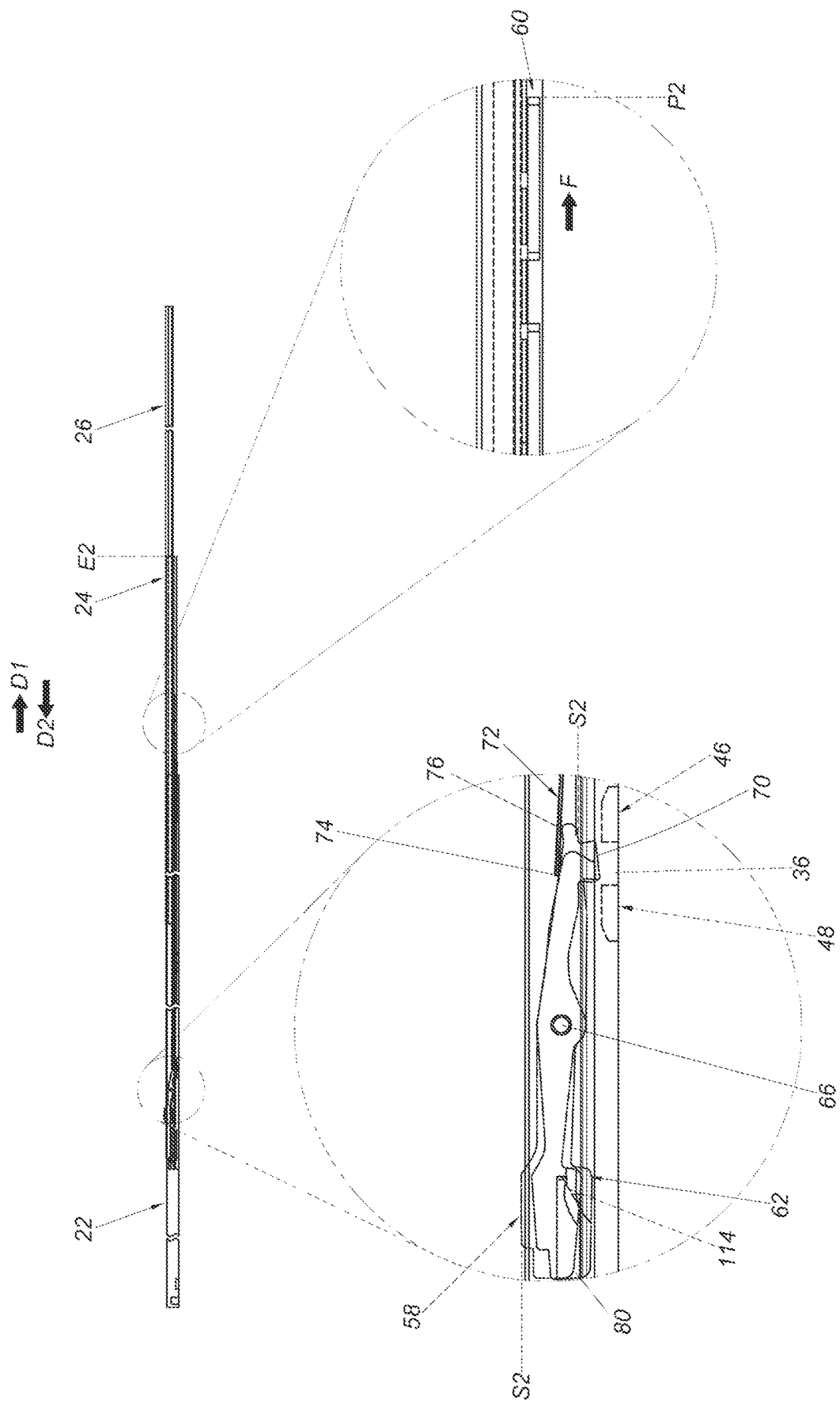
FIG. 20 is a diagram of the slide rail assembly as the second rail and the operating member are respectively located at the second extended position and the second operating position according to the embodiment of the present invention.

Besides, as shown in FIG. 19 and FIG. 20, when the second rail 24 is located at the second extended position E2 relative to the first rail 22, the positioning member 62 can be driven to move away from the first state S1 not only by the third rail 26 displacing along the retracting direction D2, as mentioned above, but also by the operating member 60 moving from the first operating position P1 to the second operating position P2. Specifically, when the second rail 24 is located at the second extended position E2 relative to the first rail 22, the operating member 60 can be operated to move from the first operating position P1 to the second operating position P2 along the opening direction D1 to drive the positioning member 62 to move from the first state S1 to the second state S2 by the second driving section 114 for disengaging the positioning portion 70 of the positioning member 62 from the positioning feature 36 to allow the second rail 24 to displace relative to the first rail 22 from the second extended position E2 to the retracted position R along the retracting direction D2 or to the first extended position E1 along the opening direction D1. Furthermore, when the operating member 60 is located at the second operating position P2, the engaging feature 88 engages with the predetermined portion 100 of the auxiliary member 57 for retaining the operating member 60 at the second operating position P2.

In contrast to the prior art, the present invention has following characteristics.

1. The operating member 60 can be retained at the second operating position P2 when the engaging feature 88 engages with the predetermined portion 100, and the operating member 60 can be released to move from the second operating position P2 to the first operating position P1 in response to the recovering resilient force F' provided by the recovering resilient member 64 when the engaging feature 88 disengages from the predetermined portion 100. Besides, a moving direction of the operating member 60 from the first operating position P1 to the second operating position P2 is the same as the opening direction D1, so as to achieve more intuitive operation of the operating member 60 from the first operating position P1 to the second operating position P2.

2. The blocking member 58 and the positioning member 62 share the same pivoting shaft 66, and the extending direction of the pivoting shaft 66 is parallel to the height direction or the vertical direction, i.e., the blocking member 58 and the positioning member 62 are configured to pivot relative to the longitudinal wall 56 of the second rail 24 laterally or transversely. Such configuration can prevent any close contact in a blocking relation between the blocking portion 68 of the blocking member 58 and the blocking feature 32 and a blocking relation between the positioning portion 70 of the positioning member 62 and the positioning feature 36, so as to have advantages of less resistive forces and labor saving.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly comprising:
   a first rail;
   a blocking feature arranged on the first rail;
   a second rail displaceable relative to the first rail;
   an auxiliary member arranged on the second rail, the auxiliary member comprising a resilient arm and a predetermined portion arranged on the resilient arm;
   a pivoting shaft;
   a blocking member pivotally connected to the second rail by the pivoting shaft, the blocking member being movably switchable between a first state and a second state relative to the second rail, the blocking member comprising a blocking portion and an abutting portion, the pivoting shaft being located between the blocking portion and the abutting portion; and
   an operating member configured to operate the blocking member, and the operating member comprising an engaging feature;
   wherein when the second rail is located at a first extended position relative to the first rail, the blocking feature blocks the blocking portion of the blocking member in the first state for preventing the second rail from displacing away from the first extended position along a retracting direction;
   wherein when the operating member moves from a first operating position to a second operating position, the abutting portion of the blocking member is driven by the operating member to switch the blocking member from the first state to the second state, such that the blocking feature does not block the blocking portion of the blocking member in the second state for allowing the second rail to displace relative to the first rail away from the first extended position along the retracting direction;
   wherein when the operating member is located at the second operating position, the engaging feature engages with the predetermined portion of the auxiliary member to retain the operating member at the second operating position.

2. The slide rail assembly of claim 1, wherein the operating member is movably mounted on the second rail.

3. The slide rail assembly of claim 1, wherein when the operating member is located at the second operating position, the operating member is configured to retain the blocking member in the second state.

4. The slide rail assembly of claim 3, further comprising a positioning member movably mounted on the second rail and switchable between a first state and a second state relative to the second rail, and when the operating member is located at the second operating position, the operating member being configured to retain the positioning member in the second state.

5. The slide rail assembly of claim 4, wherein the auxiliary member further comprises a mounting portion connected to the second rail, and the resilient arm extends from the mounting portion.

6. The slide rail assembly of claim 4, further comprising a recovering resilient member, and when the engaging feature disengages from the predetermined portion of the auxiliary member, the operating member moving from the second operating position to the first operating position in response to a recovering resilient force provided by the recovering resilient member.

7. The slide rail assembly of claim 6, further comprising a first resilient feature, and when the operating member is located at the first operating position, the blocking member moving from the second state to the first state in response to a first resilient force provided by the first resilient feature.

8. The slide rail assembly of claim 7, further comprising a second resilient feature, and when the operating member is located at the first operating position, the positioning member moving from the second state to the first state in response to a second resilient force provided by the second resilient feature.

9. The slide rail assembly of claim 8, further comprising a predetermined object connected to the second rail, and the predetermined object comprising the first resilient feature and the second resilient feature.

10. The slide rail assembly of claim 9, further comprising a releasing feature arranged on the first rail, and when the second rail displaces from the first extended position to a retracted position along the retracting direction, the resilient arm of the auxiliary member being driven by the releasing feature to disengage the engaging feature from the predetermined portion of the auxiliary member.

11. The slide rail assembly of claim 10, further comprising a positioning feature arranged on the first rail, and when the second rail displaces relative to the first rail from the retracted position to a second extended position along an opening direction, the positioning member in the first state engaging with the positioning feature for preventing the second rail from displacing relative to the first rail away from the second extended position along the retracting direction.

12. The slide rail assembly of claim 11, wherein when the second rail is located at the first extended position, the slide rail assembly has a first length, and when the second rail is located at the second extended position, the slide rail assembly has a second length less than the first length.

13. The slide rail assembly of claim 11, further comprising a third rail, the second rail being movably mounted between the first rail and the third rail.

14. The slide rail assembly of claim 13, wherein when the second rail is located at the second extended position, the third rail displacing relative to the second rail away from an opened position along the retracting direction drives the positioning member to move away from the first state to disengage the positioning member from the positioning feature for allowing the second rail to displace relative to the first rail away from the second extended position along the retracting direction.

15. The slide rail assembly of claim 11, wherein when the second rail is located at the second extended position, the operating member moving from the first operating position to the second operating position drives the positioning member to move away from the first state to disengage the positioning member from the positioning feature for allowing the second rail to displace relative to the first rail away from the second extended position along the retracting direction, and when the operating member is located at the second operating position, the engaging feature engages with the predetermined portion of the auxiliary member to retain the operating member at the second operating position.

16. The slide rail assembly of claim 4, wherein the blocking member and the positioning member are pivotally connected to the second rail by the pivoting shaft.

17. A slide rail assembly comprising:
    a first rail;
    a blocking feature arranged on the first rail;
    a positioning feature arranged on the first rail;
    a second rail displaceable relative to the first rail;

an auxiliary member arranged on the second rail, the auxiliary member comprising a resilient arm and a predetermined portion arranged on the resilient arm;
a third rail displaceable relative to the second rail;
a pivoting shaft;
a blocking member;
a positioning member, the blocking member and the positioning member being pivotally connected to the second rail by the pivoting shaft, the blocking member and the positioning member being movably switchable between a first state and a second state relative to the second rail, the blocking member comprising a blocking portion and an abutting portion, the pivoting shaft being located between the blocking portion and the abutting portion; and
an operating member configured to operate the blocking member, and the operating member comprising an engaging feature;
wherein when the second rail is located at a first extended position relative to the first rail, the blocking feature blocks the blocking portion of the blocking member in the first state for preventing the second rail from displacing relative to the first rail away from the first extended position along a retracting direction;
wherein when the operating member moves from a first operating position to a second operating position, the abutting portion of the blocking member is driven by the operating member to switch the blocking member from the first state to the second state, such that the blocking feature does not block the blocking portion of the blocking member in the second state for allowing the second rail to displace relative to the first rail away from the first extended position along the retracting direction;
wherein when the operating member is located at the second operating position, the engaging feature engages with the predetermined portion of the auxiliary member to retain the operating member at the second operating position;
wherein when the operating member is located at the second operating position, the operating member is configured to retain the blocking member in the second state;
wherein when the second rail is located at the first extended position relative to the first rail and the blocking member is in the second state, the blocking feature does not block the blocking member in the second state for allowing the second rail to displace relative to the first rail from the first extended position to a retracted position along the retracting direction.

18. The slide rail assembly of claim 17, wherein when the second rail displaces relative to the first rail from the retracted position to a second extended position along an opening direction, the positioning member in the first state engages with the positioning feature for preventing the second rail from displacing relative to the first rail away from the second extended position, and when the second rail is located at the second extended position relative to the first rail, the operating member moving from the first operating position to the second operating position drives the positioning member to move away from the first state to disengage the positioning member from the positioning feature for allowing the second rail to displace relative to the first rail away from the second extended position along the retracting direction or the opening direction.

19. The slide rail assembly of claim 18, further comprising a recovering resilient member and a first resilient feature, when the engaging feature disengages from the predetermined portion of the auxiliary member, the operating member moving from the second operating position to the first operating position in response to a recovering resilient force provided by the recovering resilient member, when the operating member is located at the first operating position, the blocking member moving from the second state to the first state in response to a first resilient force provided by the first resilient feature, the slide rail assembly further comprising a releasing feature arranged on the first rail, and when the second rail displaces relative to the first rail from the first extended position to the retracted position along the retracting direction, the resilient arm of the auxiliary member being driven by the releasing feature to disengage the engaging feature from the predetermined portion of the auxiliary member.

20. The slide rail assembly of claim 18, wherein the operating member moving from the first operating position to the second operating position along the opening direction drives the blocking member to move from the first state to the second state.

* * * * *